United States Patent
Suzuki

(10) Patent No.: US 11,436,084 B2
(45) Date of Patent: *Sep. 6, 2022

(54) SEMICONDUCTOR DEVICE HAVING ERROR CORRECTION CODE (ECC) CIRCUIT

(71) Applicant: Micron Technology, Inc., Boise, ID (US)

(72) Inventor: Takamasa Suzuki, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/239,471

(22) Filed: Apr. 23, 2021

(65) Prior Publication Data

US 2021/0263796 A1    Aug. 26, 2021

Related U.S. Application Data

(60) Continuation of application No. 16/529,600, filed on Aug. 1, 2019, now Pat. No. 11,016,845, which is a
(Continued)

(30) Foreign Application Priority Data

Jan. 8, 2015    (JP) ................. 2015-002415

(51) Int. Cl.
*G06F 11/00*    (2006.01)
*G06F 11/10*    (2006.01)
*G11C 29/02*    (2006.01)
*G11C 29/42*    (2006.01)
*G11C 29/52*    (2006.01)
(Continued)

(52) U.S. Cl.
CPC ...... *G06F 11/1068* (2013.01); *G06F 11/1048* (2013.01); *G11C 29/021* (2013.01); *G11C 29/028* (2013.01); *G11C 29/42* (2013.01); *G11C 29/52* (2013.01); *G11C 11/401* (2013.01); *G11C 2029/0411* (2013.01)

(58) Field of Classification Search
None
See application file for complete search history.

(56) References Cited

U.S. PATENT DOCUMENTS 4,498,175 A    2/1985 Nagumo et al.
4,845,713 A    7/1989 Zook
(Continued)

*Primary Examiner* — Esaw T Abraham
(74) *Attorney, Agent, or Firm* — Dorsey & Whitney LLP

(57) ABSTRACT

An apparatus may comprise an ECC circuit configured to receive read data from a memory cell array to correct, an error bit contained in a data portion of the read data responsive, at least in part, to a parity portion of the read data, to generate a plurality of first error determination signals and a plurality of second error determination signals. Each of the plurality of first error determination signals provided in common to n data terminals and corresponding to an associated one of burst data of m bits. Each of the plurality of second error determination signals provided in common to the burst data of m bits and corresponding to an associated one of the n data terminals. The error bit of the data portion of the read data is detected based, at least in part, on the first error determination signals and the second error determination signals.

21 Claims, 22 Drawing Sheets

Related U.S. Application Data continuation of application No. 15/601,652, filed on May 22, 2017, now Pat. No. 10,409,675, which is a division of application No. 14/852,259, filed on Sep. 11, 2015, now Pat. No. 9,690,653.

(51) Int. Cl.
*G11C 11/401* (2006.01)
*G11C 29/04* (2006.01)

(56) References Cited

U.S. PATENT DOCUMENTS

| | | |
|---|---|---|
| 5,384,788 A | 1/1995 | Parks et al. |
| 5,483,236 A * | 1/1996 | Bi .................. H03M 13/151 |
| | | 341/94 |
| 5,771,246 A * | 6/1998 | Weng ................ H03M 13/17 |
| | | 714/784 |
| 6,738,942 B1 * | 5/2004 | Sridharan ........... H03M 13/29 |
| | | 714/755 |
| 7,171,591 B2 | 1/2007 | Chen |
| 7,739,576 B2 | 6/2010 | Radke |
| 7,836,377 B2 | 11/2010 | Toda |
| 7,941,733 B2 | 5/2011 | Toda |
| 7,984,363 B2 | 7/2011 | Kushida |
| 8,122,328 B2 | 2/2012 | Liu et al. |
| 8,316,279 B2 | 11/2012 | Kim et al. |
| 8,560,927 B1 | 10/2013 | Pagiamtzis et al. |
| 8,739,005 B2 | 5/2014 | Uchikawa |
| 8,869,006 B2 * | 10/2014 | Blaum ................ H03M 13/033 |
| | | 714/6.2 |
| 8,959,418 B1 | 2/2015 | Pfister et al. |
| 9,043,674 B2 | 5/2015 | Wu et al. |
| 9,246,515 B2 * | 1/2016 | Kong ..................... G06F 11/10 |
| 9,270,299 B2 | 2/2016 | Luby et al. |
| 9,690,653 B2 | 6/2017 | Suzuki |
| 9,698,830 B2 | 7/2017 | Motwani et al. |
| 2002/0133781 A1 | 9/2002 | Mikkola et al. |
| 2003/0023924 A1 | 1/2003 | Davis et al. |
| 2003/0135810 A1 * | 7/2003 | Hsu .................. H03M 13/6502 |
| | | 714/784 |
| 2006/0090114 A1 | 4/2006 | Duffy et al. |
| 2009/0319863 A1 * | 12/2009 | Shirai ................ G06F 11/1068 |
| | | 714/755 |
| 2017/0269997 A1 | 9/2017 | Suzuki |
| 2019/0354432 A1 | 11/2019 | Suzuki |

* cited by examiner

Fig. 11

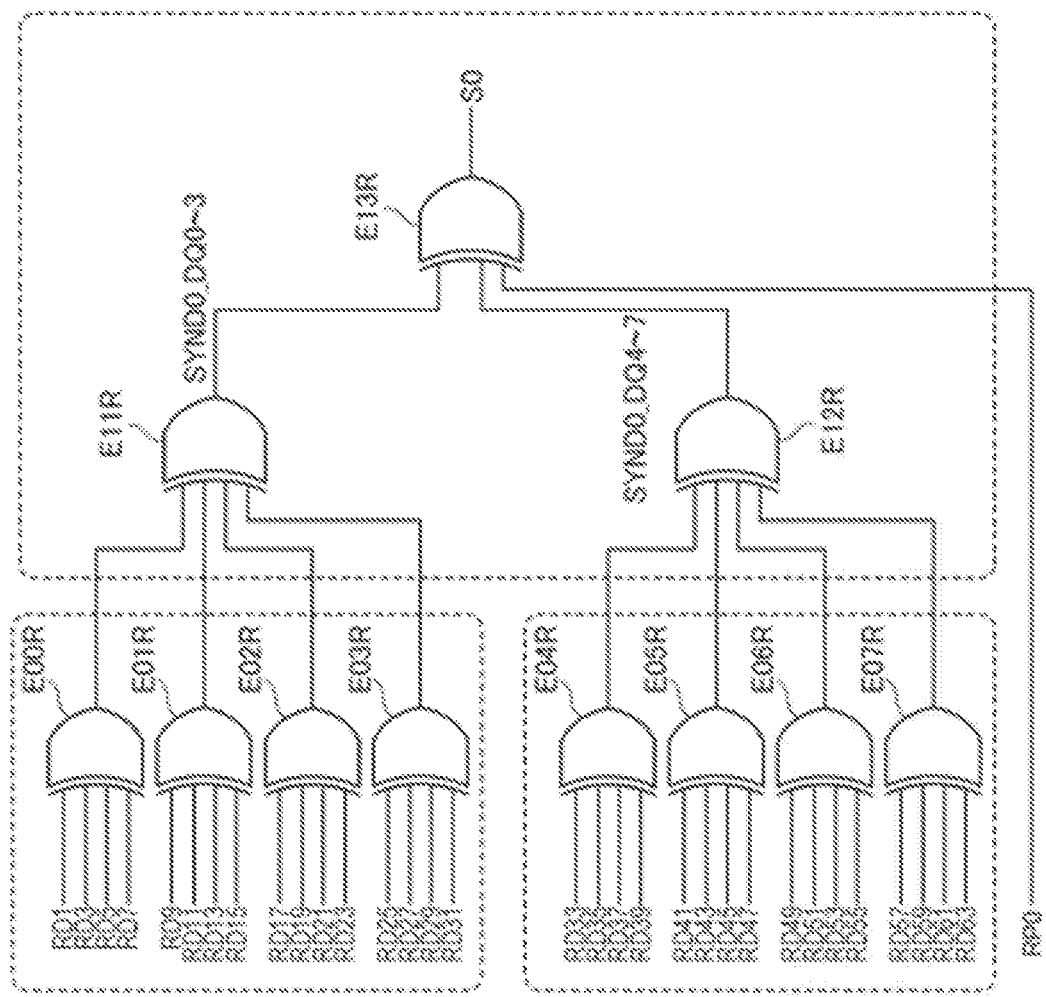
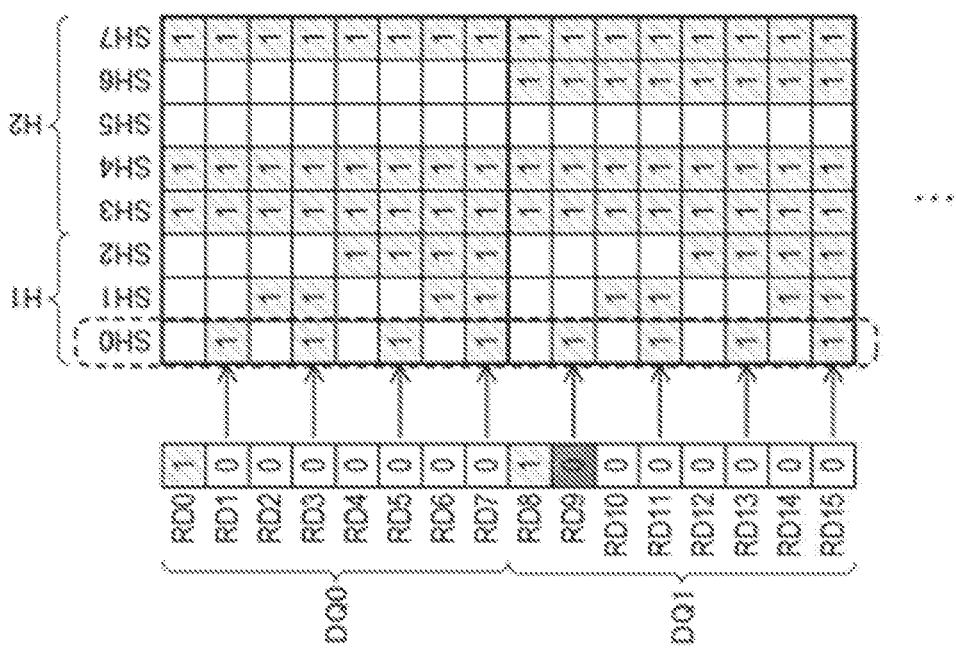
Fig. 12(a)
Fig. 12(b)

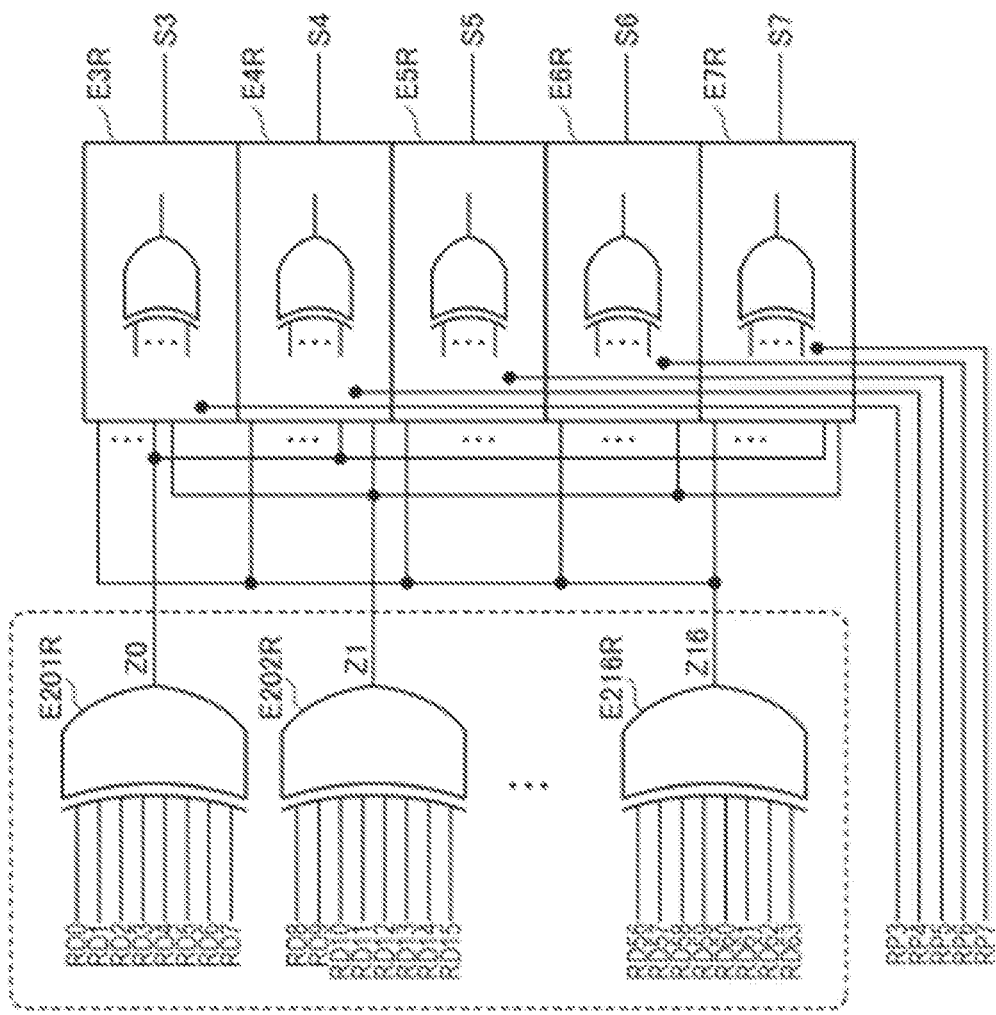
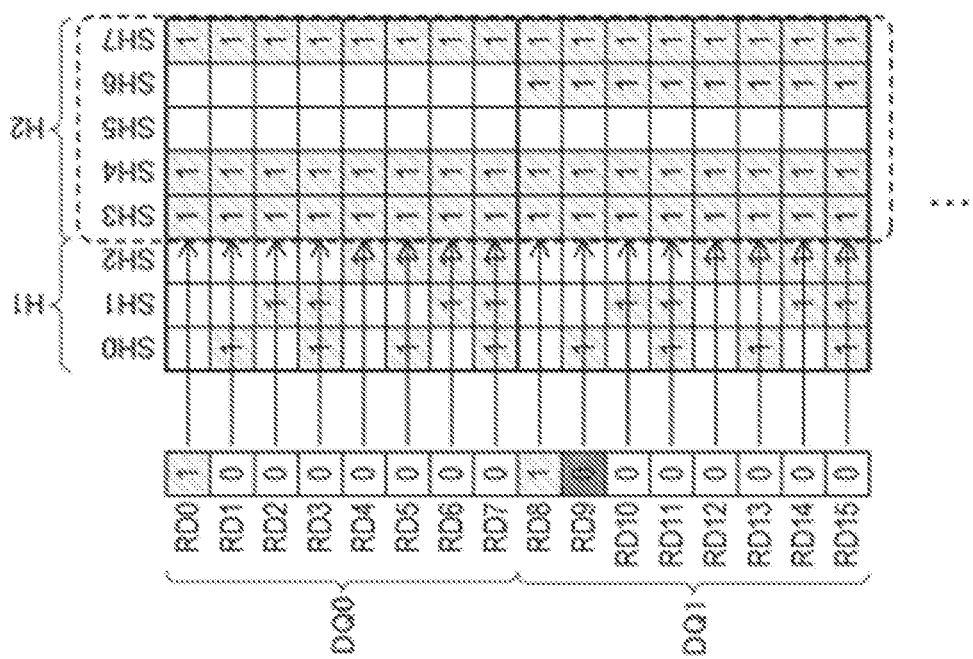
Fig. 13(a)
Fig. 13(b)

SEMICONDUCTOR DEVICE HAVING ERROR CORRECTION CODE (ECC) CIRCUIT

CROSS-REFERENCE TO RELATED APPLICATIONS

This application is a continuation of U.S. application Ser. No. 16/529,600 filed on Aug. 1, 2019, and issued as U.S. Pat. No. 11,016,845 on May 25, 2021, which is a continuation application is a continuation of U.S. application Ser. No. 15/601,652 filed on May 22, 2017 and issued as U.S. Pat. No. 10,409,675 on Sep. 10, 2019, which is a divisional of U.S. application Ser. No. 14/852,259 filed on Sep. 11, 2015 and issued as U.S. Pat. No. 9,690,653 on Jun. 27, 2017, which is based upon and claims the benefit of priority from Japanese Patent Application No. 2015-002415 filed on Jan. 8, 2015, the disclosures of which are incorporated herein in their entirely by reference.

FIELD OF THE INVENTION

This invention relates to a semiconductor device, in particular, a semiconductor device that has an error correction code (ECC) circuit.

In recent years, a semiconductor device, such as a DRAM (Dynamic Random Access Memory), has had a greatly-increased capacity, and the number of occurrences of defective bits has also increased accordingly. Of the defective bits, ones due to a defective word line or a defective bit line are mainly relieved by replacement with a redundant word line or a redundant bit line. However, regarding sporadic defective bits occurring after packaging or the like, it is difficult in some cases to relieve them by replacement with a redundant word line or a redundant bit line. For such sporadic defective bits, a method of relieving data by using an error correcting function, not by performing replacement using a redundant circuit is adopted in some cases.

As one example, non-patent literature 1 (ISSCC2014/SESSION25/HIGH-BANDWIDTH LOW-POWER DRAM AND I/O/25.1) discloses a DRAM equipped with an ECC (Error Correction Circuit).

However, the non-patent literature 1 does not disclose what determinant is used to perform encoding and decoding by the ECC. An encoding circuit or a decoding circuit included in the ECC has a circuit configuration dependent on a determinant to be used, and consequently the operation speed thereof also depends on the determinant to be used. The present invention devises a determinant to be used, thereby providing a semiconductor device capable of performing more efficient error correction.

BRIEF DESCRIPTION OF THE DRAWINGS

FIG. 11 is a diagram for illustrating a function of a syndrome generator 120.

FIG. 12(a) is an illustrative diagram for illustrating a method of generating a syndrome S0, and FIG. 12(b) is a circuit diagram of a circuit generating the syndrome bit S0.

FIG. 13(a) is an illustrative diagram for illustrating a method of generating syndromes S3 to S7, and FIG. 13(b) is a circuit diagram of a circuit generating the syndromes S3 to S7.

DETAILED DESCRIPTION OF PREFERRED EMBODIMENTS

In one embodiment, there is provided an apparatus comprising n data terminals, each of the 11 data terminals being configured to input or output burst data of m bits, each of n and m being an integer more than 1, a memory cell array into which write data is written and from which read data is read, each of the write data and the read data comprising a data portion of m*n bits and a parity portion of k bits, k being an integer more than 1, and an ECO control circuit. The ECC control circuit is configured to receive the read data from the memory cell array to correct, if any, an error bit contained in the data portion of the read data responsive, at least in part, to the parity portion of the read data, to generate a plurality of first error determination signals and a plurality of second error determination signals, each of the plurality of first error determination signals being provided in common to the n data terminals and corresponding to an associated one of the burst data of m bits, each of the plurality of second error determination signals being provided in common to the burst data of m bits and corresponding to an associated one of the n data terminals, and to detect the error bit of the data portion of the read data based, at least in part, on the first error determination signals and the second error determination signals.

In another embodiment, there is provided an apparatus comprising a memory cell array, a syndrome generator configured to generate a syndrome, which contains a first syndrome portion of p bits and a second syndrome portion of q bits, based on read data of m*n bits and a read partly read from the memory cell array, the read data of m*n bits being defined as m groups of n bits mad data or n groups of m bits read data, each of the m, n, p and q being an integer more than 1, and an error locator configured to specify the location of the error bit within the m groups based on the first syndrome portion, and to specify the location of the error bit within the n groups based on the second syndrome portion.

In still another embodiment, there is provided an apparatus comprising a memory cell array, a plurality of data terminals into which a plurality of write data are burst-inputted, a data mask terminal configured to receive a plurality of data mask signals corresponding to the plurality of burst data, respectively, a multiplexer configured to generate data tor parity generation by synthesizing the write data and a plurality of read data read from the memory cell array based on the data mask signals, an encoder configured to generate a write parity based on the data for parity generation, a syndrome generator configured to generate a syndrome based on the read data and a read parity read from the memory cell array, and a convener configured to convert a value of the write parity based on the syndrome and the data mask signal.

Figure 1:
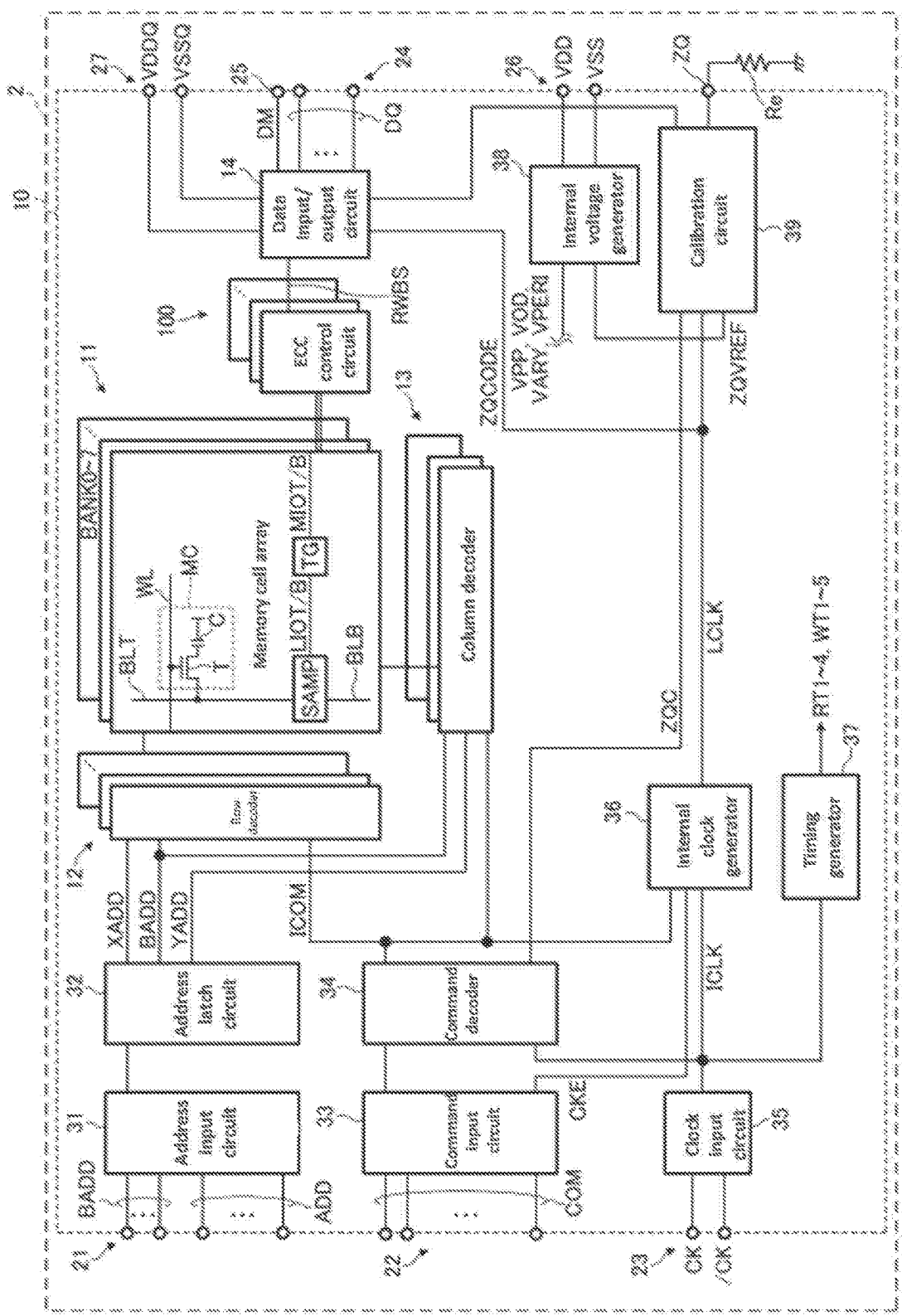
FIG. 1 is a block diagram of a semiconductor device 10 according to a preferred embodiment of Ore present invention.

FIG. 1 is a block diagram showing an entire configuration of a semiconductor device 10 according to a preferred embodiment of the present invention.

The semiconductor device 10 according to the embodiment is a DRAM of DDR4 (Double Data Rate 4) type integrated on a single semiconductor chip, and is mounted on a substrate 2. The substrate 2 is a memory module substrate or a motherboard, and is provided with a resistor Re. The resistor Re is connected to a calibration terminal ZQ of the semiconductor device 10, and impedance thereof is used as a reference impedance of a calibration circuit 39. In the embodiment, the resistor Re is supplied with a ground potential VSS.

As shown in FIG. 1, the semiconductor device 10 has a memory cell array 11. The memory cell array 11 is divided into eight banks BANK0 to BANK7, each bank is provided with a plurality of word lines WL and a plurality of bit lines BLT, BLB, and a memory cell MC is disposed at an intersection of these lines. The memory cell MC is a DRAM cell having a cell transistor T and a memory cell capacitor C connected in series.

Selection of the word line WL is performed by a row decoder 12, while selection of the bit line BL is performed by a column decoder 13. As shown in FIG. 1, the row decoder 12 and the column decoder 13 are provided for each of BANK0 to BANK7.

The bit lines BLT, BLT paired are connected to a sense amplifier SAMP. Read data read from the bit line BLT or the bit line BLB is amplified by the sense amplifier SAMP, and thereafter transferred to an ECC control circuit 100 via complementary local data lines LIOT/LIOB, a switch circuit TG, and complementary main data lines MIOT/MIOB. The ECC control circuit 100 is also provided for each of BANK0 to BANK7.

Though the details will be described later, when the read data is read from the memory cell array 11, a parity is also simultaneously read. Conversely, write data outputted from the ECC control circuit 100 is transferred to the sense amplifier SAMP via the complementary main data lines MIOT/MIOB, the switch circuit TG, and the complementary local data lines LIOT/LIOB, and written in the memory cell MC connected to the bit line BLT or the bit line BLB.

Though the details will be described later, when the write data is written in the memory cell array 11, a parity is also simultaneously written.

Further, the semiconductor device 10 is provided with an address terminal 21, a command terminal 22, a clock terminal 23, a data terminal 24, a data mask terminal 25, voltage terminals 26, 27, and a calibration terminal ZQ as external terminals.

The address terminal 21 is a terminal into which an address signal ADD and a bank address signal BADD are inputted from outside. The address signal ADD inputted in the address terminal 21 is supplied to an address latch circuit 32 via an address input circuit 31, and latched therein. Of signals latched by the address latch circuit 32, a row address signal XADD and a bank address signal BADD are supplied to the row decoder 12, while a column address signal YADD and the bank address signal BADD are supplied to the column decoder 13.

One of the row decoders 12 corresponding to BANK0 to BANK7 is selected on the basis of the bank address signal BADD, and selects a predetermined word line WL on the basis of the row address signal XADD. One of the column decoders 13 corresponding to BANK0 to BANK7 is selected on the basis of the bank address signal BADD, and selects a predetermined sense amplifier SAMP on the basis of the column address signal YADD.

The command terminal 22 is a terminal into which a command signal COM is inputted from outside. The command signal COM inputted in the command terminal 22 is supplied to a command decoder 34 via a command input circuit 33. The command decoder 34 is a circuit decoding the command signal COM and thereby generating various internal commands ICOM. The internal commands ICOM are supplied to the row decoder 12, the column decoder 13, a timing generator 37, and the like.

For example, if an active command and a read command are inputted as the command signals COM, and, in synchronism therewith, the row address XADD and the column address YADD are inputted, read data and a parity are read from the memory cell MC designated by these row address XADD and column address YADD. The read data and parity are inputted into the ECC control circuit 100, and if an error bit is contained in the read data, the read data is corrected. The corrected read data DQ is burst-outputted from the data terminal 24 to outside via a data input/output circuit 14. Though not particularly limited, the embodiment is provided with eight data terminals 24 (DQ0 to DQ7), and, during read operation, read data of 8 bits DQ is burst-outputted from each data terminal 24. Accordingly, read data of 64 bits DQ is outputted in one read operation.

On the other hand, if an active command and a write command are inputted as the command signals COM, in synchronism therewith, the row address XADD and the column address YADD are inputted, and thereafter write data DQ is burst-inputted into the data terminal 24, the write data DQ is supplied to the ECC control circuit 100 via the data input/output circuit 14, and a parity is generated on the basis of the write data. The write data and the parity are supplied to the memory cell array 11, and written into the memory cell MC designated by the row address XADD and the column address YADD. As described above, when eight data terminals 24 are provided and the burst number is eight bits, write data of 64 bits DQ is inputted in one write operation.

During the write operation, a data mask signal DM can be inputted into the data mask terminal 25. If the data mask signal DM is inputted, corresponding burst data of the write data DQ to be burst-inputted is masked.

External clock signals CK,/CK are inputted into the clock terminal 23. The external clock signal CK and the external clock signal/CK are signals complementary to each other, and both the external clock signals are supplied to the clock input circuit 35. The clock input circuit 35 generates an internal clock signal ICLK on receipt of the external clock signals CK,/CK. The internal clock signal ICLK is supplied to an internal clock generator 36, and thereby a phase-controlled internal clock signal LCLK is generated. Though not particularly limited, a DLL circuit can be used as the internal clock generator 36. The internal clock signal LCLK is supplied to the data input/output circuit 14, and used as a timing signal determining an output timing of the read data DQ. It should be noted that the internal clock generator 36 is activated in response to a clock enable signal CKE that is one of the command signals COM.

The internal clock signal ICLK is also supplied to the timing generator 37, and thereby a plurality of timing signals RT1 to RT4, WT1 to WT5 are generated. The timing signals RT1 to RT4, WT1 to WT5 generated by the timing generator 37 are supplied to the KCC control circuit 100, and define operation timings of the ECC control circuit 100 during the read operation and during the write operation.

The voltage terminal 26 is a terminal supplied with voltage potentials VDD, VSS. The voltage potentials VDD, VSS supplied to the voltage terminal 26 are supplied to the internal voltage generator 38. The internal voltage generator 38 generates various internal potentials VPP, VOD, VARY, VPERI, and a reference potential ZQVREF on the basis of the voltage potentials VDD, VSS. The internal potential VPP is a potential mainly used in the row decoder 12, the internal potentials VOD, VARY are potentials used in the sense amplifier SAMP in the memory cell array 11, and the internal potential VPERI is a potential used in many other circuit blocks. On the other hand, the reference potential ZQVREF is a reference potential used in the calibration circuit 39.

The voltage terminal 27 is a terminal supplied with voltage potentials VDDQ, VSSQ. The voltage potentials VDDQ, VSSQ supplied to the voltage terminal 27 are supplied to the data input/output circuit 14. The voltage potentials VDDQ, VSSQ are the same potential as the voltage potentials VDD, VSS supplied to the voltage terminal 26, respectively, but, in order to prevent voltage noise caused by the data input/output circuit 14 from propagating to the other circuit blocks, the voltage potentials VDDQ, VSSQ dedicated to the data input/output circuit 14 are used.

The calibration terminal ZQ is connected to the calibration circuit 39. When being activated by a calibration signal ZQC, the calibration circuit 39 performs a calibration operation with reference to the impedance of the resistor Re and the reference potential ZQVREF. An impedance code ZQCODE obtained by the calibration operation is supplied to the data input/output circuit 14, and thereby the impedance of an output buffer (not shown) included in the data input-output circuit 14 is designated.

Figure 2:
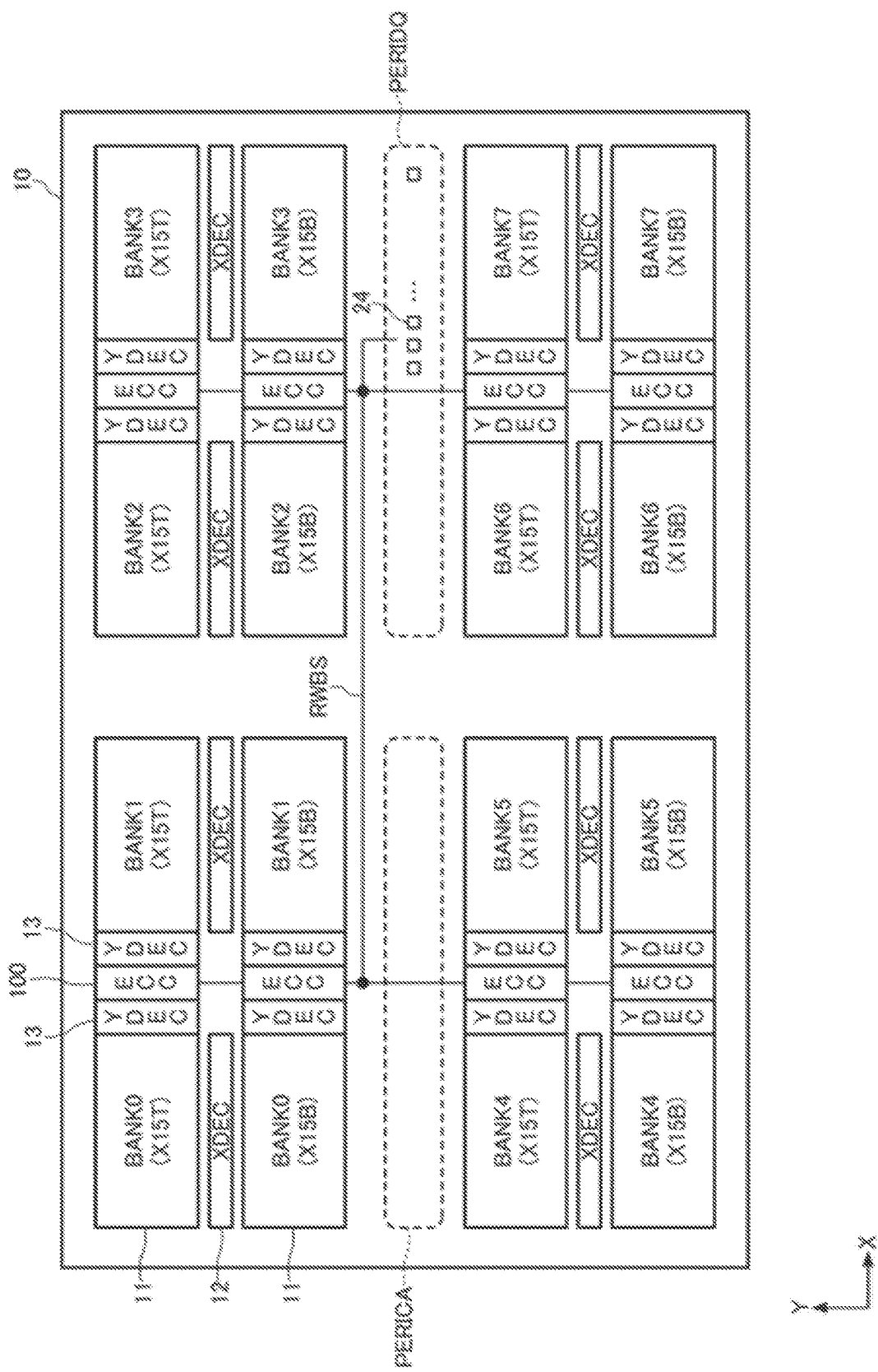
FIG. 2 is a plan view for illustrating a layout of the semiconductor device 10.

FIG. 2 is a plan view for illustrating a layout of the semiconductor device 10.

As shown in FIG. 2, the eight banks BANK0 to BANK7 constituting the memory cell array 11 are each divided into two so that 16 regions in total are constituted. The two regions constituting the same bank are exclusively selected on the basis of a most significant bit (for example, a bit X15) of the row address signal XADD. In FIG. 2, XI5T denotes a region selected when the bit X15 is at high level, while X15B denotes a region selected when the bit X15 is at low level.

These 16 regions are laid out in a matrix shape in an X direction and in a Y direction. Specifically, the two regions constituting the same bank are disposed adjacently in the Y direction, and the row decoder (XDEC) 12 corresponding to the bank is disposed therebetween. Further, one region contained in the bank BANKi (i is 0, 2, 4, 6) and the other region contained in the bank BANKi+1 are disposed adjacently in the X direction, and the corresponding column decoders (YDEC) 13 and ECC control circuit 100 are disposed therebetween. The ECC control circuit 100 is connected to the data input-output circuit 14 via a read write bus RWBS. The data input/output circuit 14 and the data terminal 24 are disposed in a center region PERIDQ between the banks BANK2, 3 and the banks BANK6, 7. In a center region PERICA between the banks BANK0, 1 and the banks BANK4, 5, the address terminal 21, the command terminal 22, the command decoder 34, and the like are disposed.

Hereinafter, a configuration and an operation of the ECC control circuit 100 will be described in detail.

Figure 3:
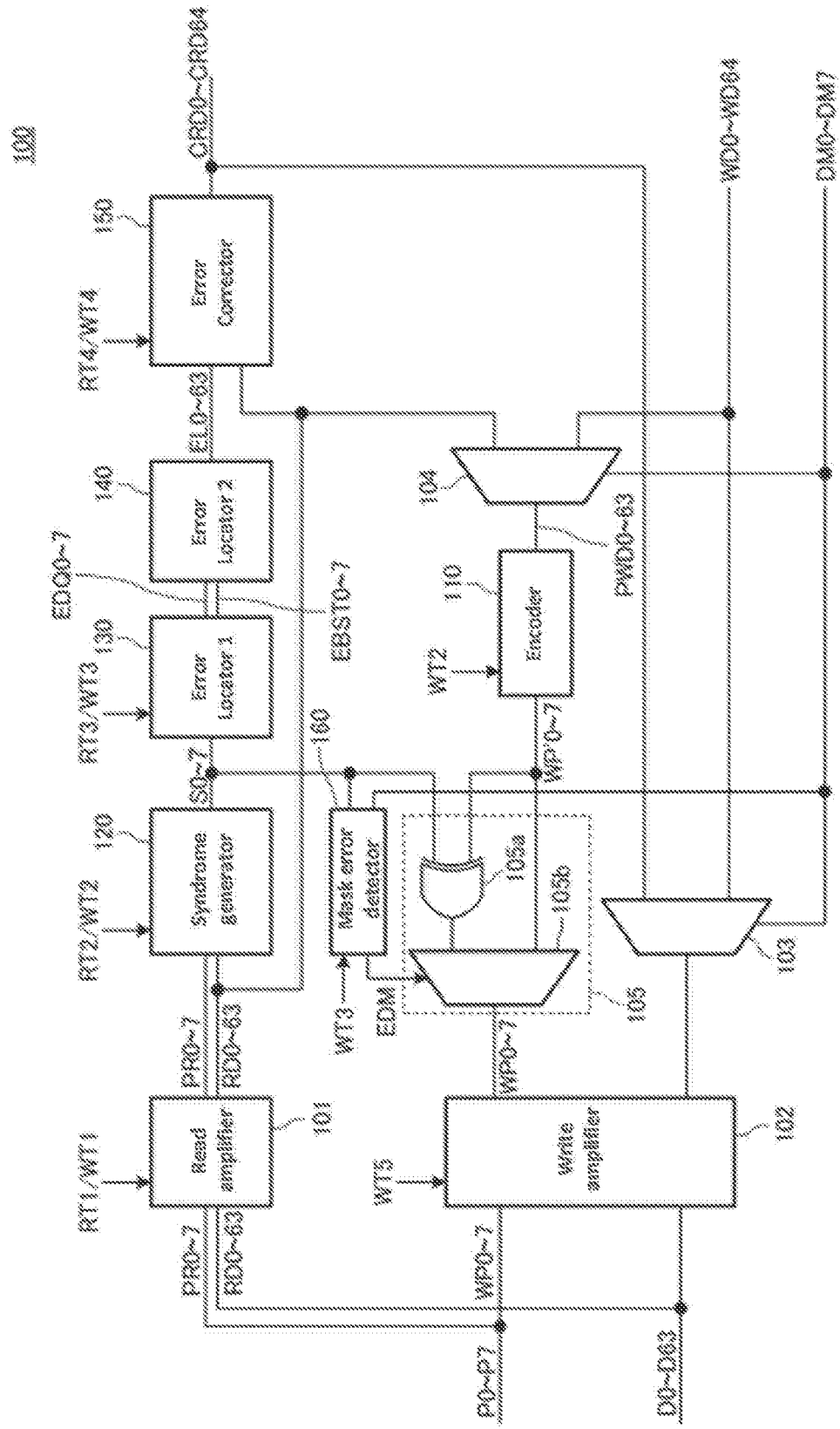
FIG. 3 is a block diagram showing a configuration of an ECC control circuit 100.

FIG. 3 is a block diagram showing the configuration of the ECC control circuit 100.

As shown in FIG. 3, the ECC control circuit 100 includes a read amplifier 101 amplifying read data of 64 bits D0 to D63 and parities P0 to P7 of 8 bits read from the memory cell array 11, and a write amplifier 102 writing the read data of 64 bits D0 to D63 and parities P0 to P7 of 8 bits into the memory cell array 11.

In this specification, the data D0 to D63 read from the memory cell array 11 may be represented by "read data RD0 to RD63", and thereby differentiated from write data or corrected read data. Further, in this specification, data inputted from outside may be represented by "write data WD0 to WD63", and thereby differentiated from read data or masked data, namely, data D0 to D63 to be actually written into the memory cell array 11. Similarly, in this specification, the parities P0 to P7 read from the memory cell array 11 may be represented by "read parities RP0 to RP7", and the parities PC to P7 to be written into the memory cell array 11 may be represented by "write parities WP0 to WP7" so that both are differentiated from each other.

The read amplifier 101 is activated in response to the timing signal RT1 during the read operation, and activated in response to the timing signal WT1 during the write operation. The reason why the read amplifier 101 is also activated during the write operation is to achieve both a data mask function and an error correction function, and the details will be described later.

The read data RD0 to RD63 and the read parities RP0 to PR7 amplified by the read amplifier 101 are supplied to a syndrome generator 120 included in the ECC control circuit 100. The syndrome generator 120 is an operational circuit generating syndromes S0 to S7 of 8 bits on the basis of the read data RD0 to RD63 and the read parities RP0 to RP7, and is activated in response to a timing signal RT2 during the read operation, and is activated in response to a timing signal WT2 during the write operation. The syndromes S0 to S7 are supplied to an error locator 130 included in the ECC control circuit 100.

The error locator 130 generates first error determination signals EBST0 to EBST7 of 8 bits and second error determination signal EDQ0 to EDQ7 of 8 bits on the basis of the syndromes S0 to S7. The error locator 130 is activated in response to a timing signal RT3 during the read operation, and activated in response to a timing signal WT3 during the write operation. Though the details are described later, the first error determination signals EBST0 to EBST7 are signals for specifying the burst location of an error bit contained in the read data RD0 to RD63. Therefore, the first error determination signals EBST0 to EBST7 are signals common to the eight data terminals 24 and independent from burst data of 8 bits, respectively. On the other hand, the second error determination signals EDQ0 to EDQ7 are signals for specifying the DQ location of an error bit contained in the read data RD0 to RD63. Therefore, the second error determination signals EDQ0 to EDQ7 are signals common to the burst data of 8 bits and independent from the eight data terminals 24, respectively.

The first error determination signals EBST0 to EBST7 and the second error determination signals EDQ0 to EDQ7 are supplied to an error locator 140 contained in the ECC control circuit 100. The error locator 140 is a circuit further decoding the first error determination signals EBST0 to EBST7 and the second error determination signals EDQ0 to EDQ7, thereby specifying an error bit contained the read data RD0 to RD63. The error bit is specified by error location signals EL0 to EL63 of 64 bits.

The error position signals EL0 to EL63 are supplied to an error corrector 150 included in the ECC control circuit 100. The error corrector 150 is also supplied with the read data RD0 to RD63, and corrects the read data RD0 to RD63 on the basis of the error location signals EL0 to EL63, thereby generating corrected read data CRD0 to CRD63. The error corrector 150 is activated in response to a timing signal RT4 during the read operation, and activated in response to a timing signal WT4 during the write operation.

The read data CRD0 to CRD63 corrected by the error corrector 150 is transferred to the data input/output circuit 14 via the read write bus RWBS, and burst-outputted to outside from the eight data terminals 24.

On the other hand, the write data WD0 to WD63 burst-inputted from outside during the write operation are supplied to the ECC control circuit 100 via the read write bus RWBS. The write data WD0 to WD63 are inputted into a first multiplexer 103 included in the ECC control circuit 100. The first multiplexer 103 synthesizes the write data WD0 to WD63 and the corrected read data CRD0 to CRD63 on the basis of data mask signals DM0 to DM7, thereby generating data D0 to D63 to be actually written into the memory cell array 11.

The data mask signals DM0 to DM7 correspond to the burst data of 8 bits, respectively, and, of the write data WD0 to WD63, burst data corresponding to the data mask signals DM0 to DM7 activated are replaced with corresponding burst data of the corrected read data CRD0 to CRD63. Thereby, a data mask function is achieved. The data D0 to D63 outputted from the first multiplexer 103 are written into the memory cell array 11 via the write amplifier 102. The write amplifier 102 is activated in response to a timing signal WT5 during the write operation.

Further, the write data WD0 to WD63 are also inputted into a second multiplexer 104 included in the ECC control circuit 100. The second multiplexer 104 synthesizes the write data WD0 to WD63 and the read data RD0 to RD63 before correction on the basis of the data mask signals DM0 to DM7, thereby generating data for parity generation PWD0 to PWD63.

The data for parity generation PWD0 to PWD63 are supplied to an encoder 110 contained in the ECC control circuit 100. The encoder 110 is activated in response to the timing signal WT2, and encodes the data for parity generation PWD0 to PWD63, thereby generating write parities WP' to WP'7. The write parities W' to WP'7 are inputted into a converter 105 included in the ECC control circuit 100.

The converter 105 is composed of an exclusive DR gate 105a logically synthesizing bits corresponding to the write parities WP70 to WP77 and the syndromes S0 to S7, and a multiplexer 105b. The operation of the multiplexer 105b included in the converter 105 is controlled by a conversion signal EDM. The conversion signal EDM is generated by a mask error detector 160 included in the ECC control circuit 100, and if the conversion signal EDM is active, the write parities WP' to WP'7 and the syndromes S0 to S7 are exclusively logically synthesized and the write parities WP0 to WP7 are generated. On the other hand, if the conversion signal EDM is inactive, the write parities WP' to WP'7 are outputted as the write parities WP0 to WP7 as they are. The write parities WP0 to WP7 are written into the memory cell array 11 via the write amplifier 102.

The mask error detector 160 is activated in response to the timing signal WT3, and determines whether or not burst data to which an error bit belongs and burst data masked by the data mask signals DM0 to DM7 are coincident with each other. As a result, if both are coincident, the conversion signal EDM is activated, but if both are not coincident, the conversion signal EDM is deactivated.

Figure 4:
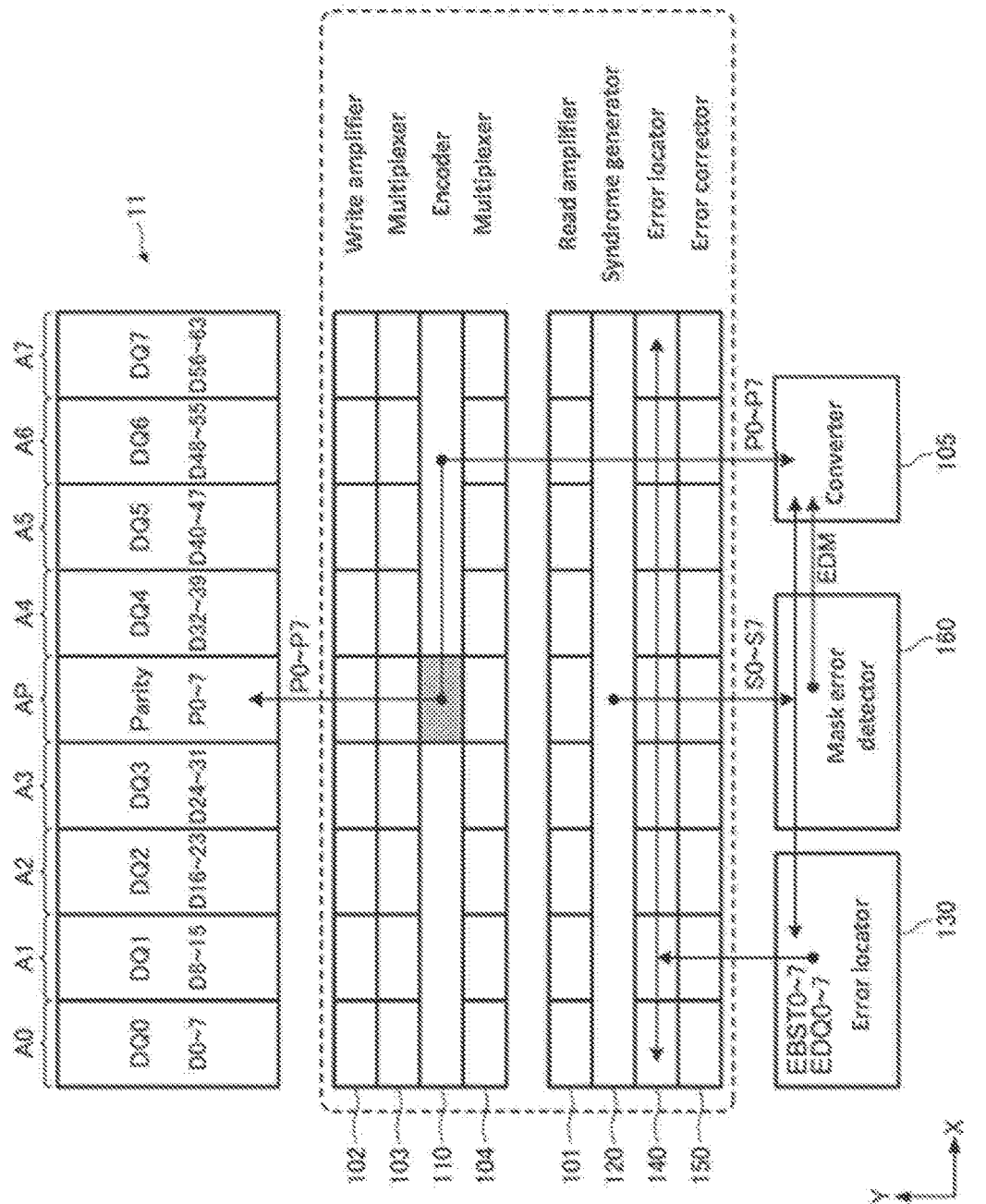
FIG. 4 is a plan view for illustrating the layout of respective circuit blocks constituting the ECC control circuit 100.

FIG. 4 is a plan view for illustrating the layout of respective circuit blocks constituting the ECC control circuit 100.

As shown in FIG. 4, the memory cell array 11 is provided with data regions A0 to A7 corresponding to the eight data terminals 24. That is, the data regions A0 to A7 store data DQ0 to DQ7 corresponding to the eight data terminals 24, respectively. Then, data of 8 bits is read from each of foe data regions A0 to A7 in one read operation, and accordingly data D0 to D63 of 64 bits in total are read all at once. Further, the memory cell array 11 is provided with a parity region AP storing foe parity. The parity region AP is disposed between the data region A3 and the data region A4, and the parities P0 to P7 of 8 bits are read from the parity region AP in one read operation. Therefore, the data D0 to D63 of 64 bits and the parities P0 to P7 of 8 bits are read all at once in one read operation.

A flow of data during the write operation is opposite to a flow of data during the read operation, and eight bits of the data D0 to D63 of 64 bits are written into each of the data regions A0 to A7, and the parities P0 to P7 of 8 bits are written into the parity region AP in one write operation.

As shown in FIG. 4, of the respective circuit blocks constituting the ECC control circuit 100, the read amplifier 101 and the write amplifier 102 are disposed so as to have Y-coordinates coincident with the respectively corresponding data regions A0 to A7 and parity region AP. This reduces and equalizes transfer distances of the data D0 to 063 and the parities P0 to P7 between the memory cell array 11, and the read amplifier 101 and the write amplifier 102.

Further, on an X-directional side opposite to the memory cell array 11 as viewed from the write amplifier 102, the first multiplexer 103, the encoder 110, and the second multiplexer 104 are disposed in this order. Thereby, the data D0 to D63 inputted from outside during the write operation is supplied to the write amplifier 102 via the first multiplexer 103, and supplied to the encoder 110 via the second multiplexer 104, and thereby the write parities WP' to WP'7 are generated. The write parities WP' to WP'7 are converted by the converter 105, if necessary, and supplied to the write amplifier 102 as the write parities WP0 to WP7.

On the other hand, on an X-directional side opposite to the memory cell array 11 as viewed from the read amplifier 101, the syndrome generator 120, the error locator 140, and the error corrector 150 are disposed in this order. Thereby, the read data RD0 to RD63 outputted from the read amplifier 101 are transferred to the syndrome generator 120, verification and correction are performed using the error locator 140 and the error corrector 150.

In this manner, the above circuit blocks constituting the ECC control circuit 100 are disposed so as to have V-coordinates coincident with the corresponding data regions A0 to A7 and the parity region AP, and this reduces and equalizes transfer distances of the data D0 to D63 and the parities P0 to P7. On the other hand, the error locator 130, the mask error detector 160, and the converter 105 are disposed in a different region from the above circuit blocks. This is because the error locator 130, the mask error detector 160, and the converter 105 are circuits operating on the basis of the syndromes S0 to S7, and do not need to be made to correspond to the data regions A0 to A7 and the parity region AP in terms of layout.

Figure 5:
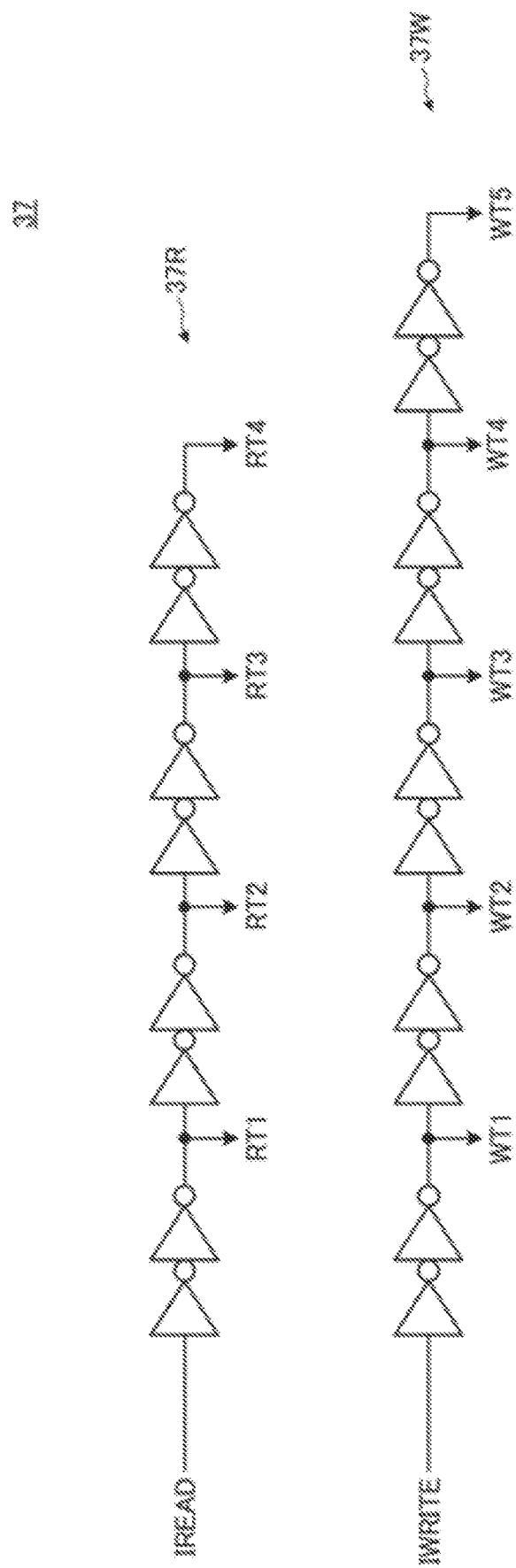
FIG. 5 is a circuit diagram of a timing generator 37.

FIG. 5 is a circuit diagram of the timing generator 37.

As shown in FIG. 5, the timing generator 37 is provided with a signal generator 37R generating the timing signals RT1 to RT4, and a signal generator 37W generating the timing signals WT1 to WT5.

The signal generator 37R generates the timing signals RT1 to RT4 on the basis of a read signal IRE AD that is a type of internal command ICOM. The read signal IREAD is a signal activated by the command decoder 34 when the command signal COM inputted into the command terminal 22 indicates a read command. The signal generator 37R is provided with a plurality of delay circuits (inverters) for timing adjustment, and thereby the timing signals RT1 to RT4 are activated in this order when the read signal IREAD is activated.

The signal generator 37W generates the timing signals WT1 to WT5 on the basis of a write signal IWRITE that is a type of internal command ICOM. The write signal IWRITE is a signal activated by the command decoder 34 when the command signal COM inputted into the command terminal 22 indicates a write command. The signal generator 37W is provided with a plurality of delay circuits (inverters) for timing adjustment, and thereby the timing signals WT1 to WT5 are activated in this order when the write signal IWRITE is activated.

The timing signals RT1 to RT4, WT1 to WT5 thus generated are supplied to the respective circuit blocks constituting the ECC control circuit 100, thereby controlling the operation timing of the ECC control circuit 100.

Next, a determinant used by the ECC control circuit 100 for an operation will be described.

Figure 6:
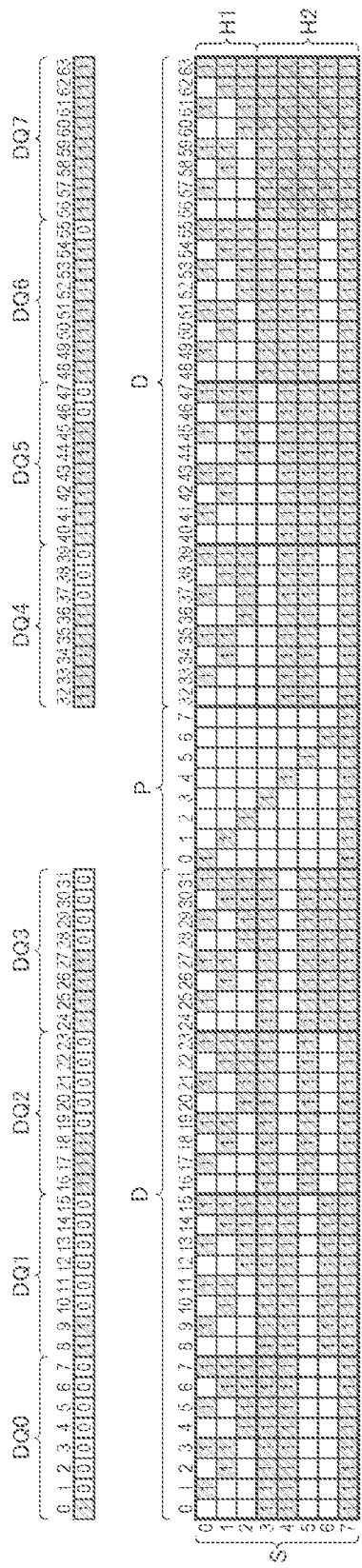
FIG. 6 is a determinant used in the preferred embodiment of the present invention.
Figure 7:
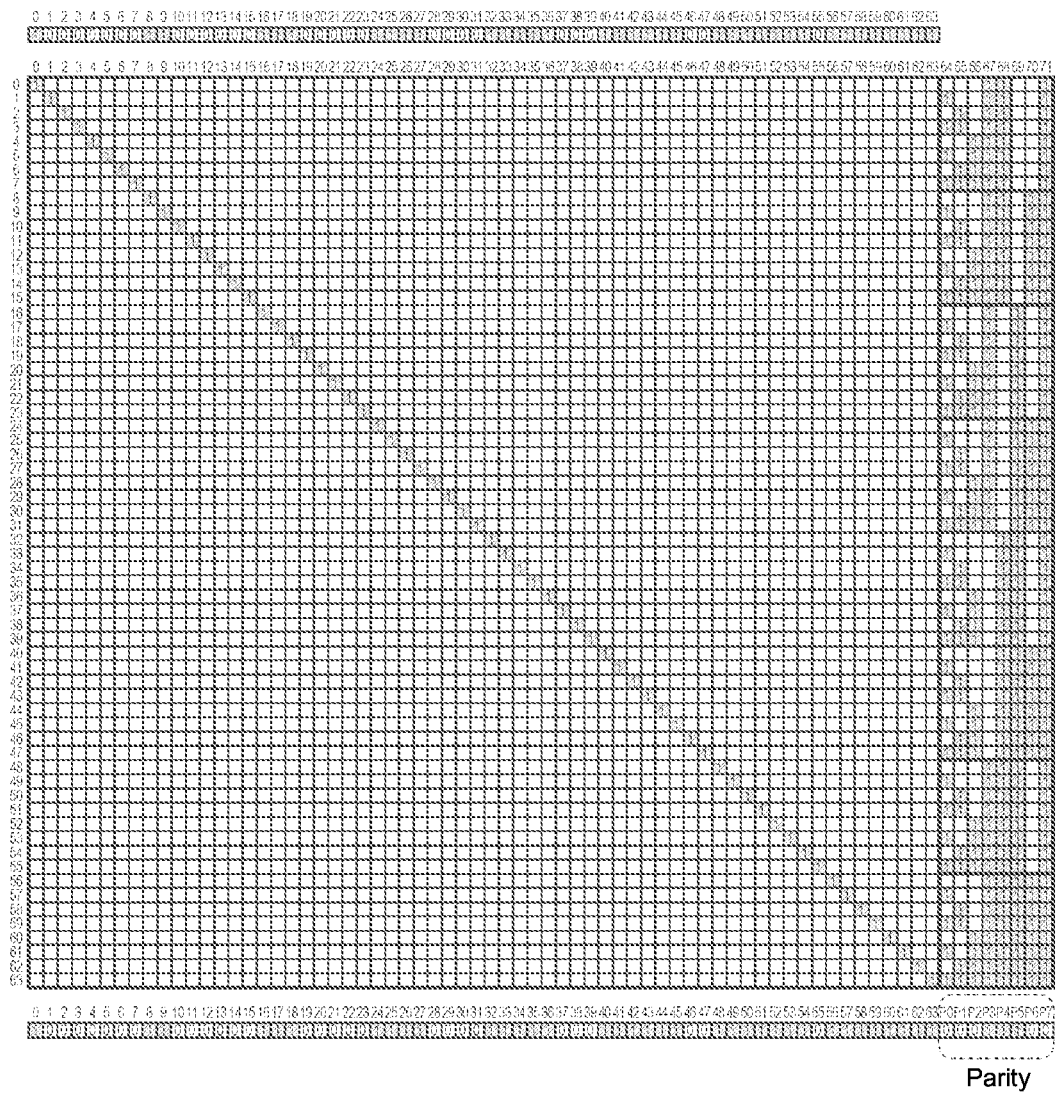
FIG. 7 is an inverted diagram of the determinant shown in FIG. 6.

FIG. 6 is a determinant used in an embodiment of the present invention, and FIG. 7 is an inverted diagram thereof.

As shown in FIG. 6 and FIG. 7, a determinant used in the embodiment is composed of a first determinant H1 corresponding to the syndromes S0 to S2, and a second determinant H2 corresponding to the syndromes S3 to S7.

The first determinant H1 has a value identical for respective data regions A0 to A7 and different for each 8 bits of the burst data. Therefore, the syndrome S0 to S2 of 3 bits obtained from the first determinant H1 indicate the burst location of an error bit. The syndromes S0 to S2 constitute a first syndrome portion. It should be noted that a bit number M of the syndrome allocated to the first determinant H1 is:

$$m < 2^M,$$

where a burst number is m. For example, if the burst number is 8 bits (m=8) like the embodiment, the bit number M of the syndrome allocated to the first determinant only needs to be equal to or more than 3.

The second determinant H2 has a value identical for the burst data of 8 bits and different for respective data regions A0 to A7. The syndromes S3 to S7 of 5 bits obtained from the second determinant 112 constitute a second syndrome portion, and, of them, S3 to S6 indicate the DQ location of an error bit, and S7 is used for detection of an error of 2 bit. It should be noted that a bit number N of the syndrome allocated to the second determinant 112 is:

$$n <\ _2C_N +\ _3C_N + \ldots\ _NC_N,$$

where the number of data terminals 24 is n. For example, if the number of data terminals 24 is eight (n=8) like the embodiment, the bit number N of the syndrome allocated to the second determinant only needs to be equal to or more than 4.

In this regard, the reason why the bit number N of the syndromes S3 to S7 allocated to the second determinant H2 in the embodiment is 5 bits is because a case where error bits are contained by 2 bits can be determined by adding the syndrome S7, and because handling of the syndromes is facilitated by setting a total bit number of the syndromes S0 to S7 at a power of 2 (=8 bits).

Regarding a determinant corresponding to the parities P0 to P7, an exclusive OR operation is performed on each parity Pj (j=0 to 7) at location of each syndrome Sj, and in addition an exclusive OR operation is performed on the respective parities P0 to P7 with respect to the syndrome S7.

Figure 8B:
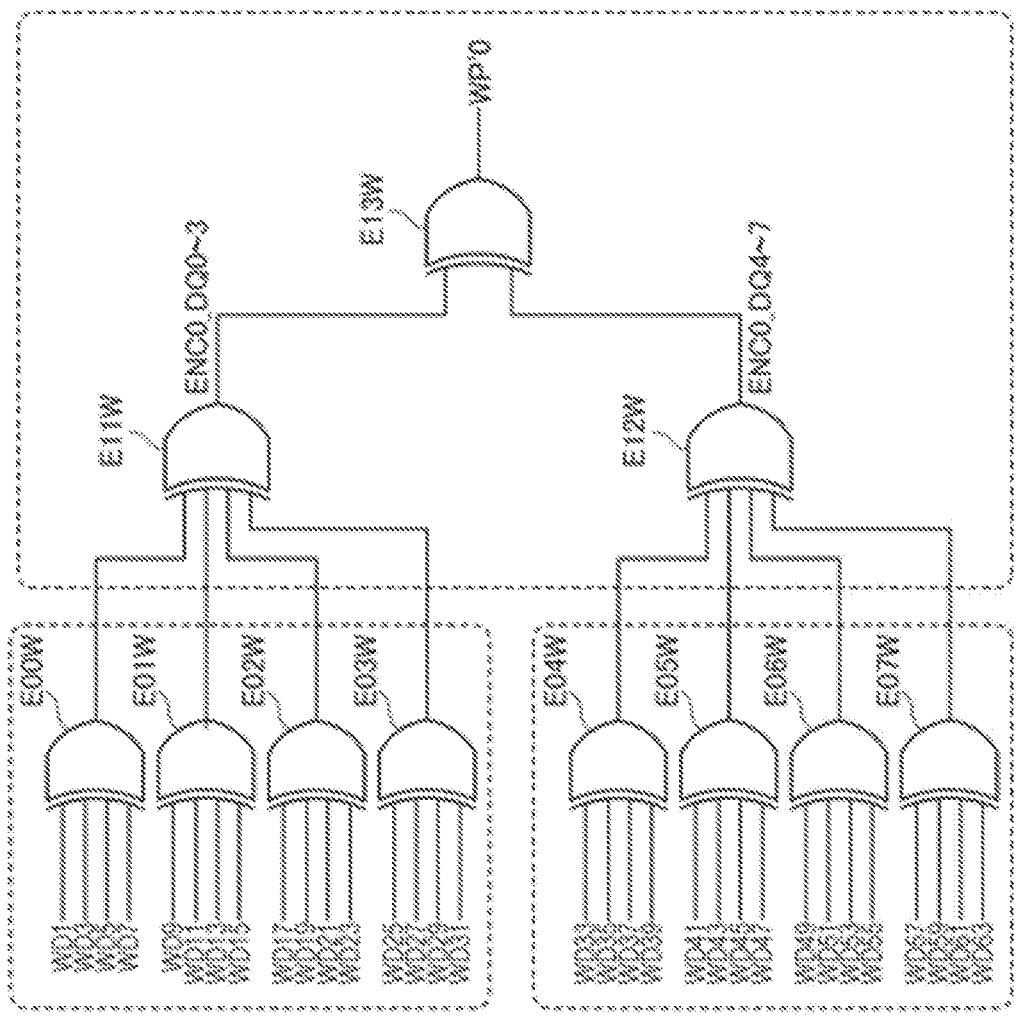
FIG. 8(b) is a circuit diagram of a circuit generating the write parity WP'.
Figure 8A:
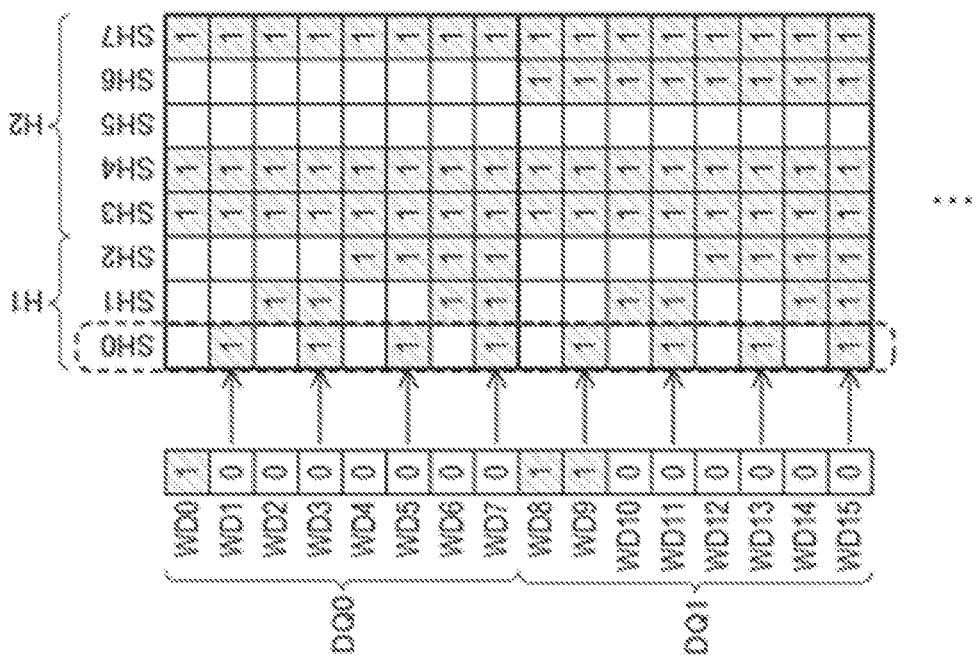
FIG. 8(a) is an illustrative diagram for illustrating a method of generating a write parity WP'.

FIG. 6 and FIG. 7 show an example of a value of the write data WD0 to WD63, and the result of an operation of the parities P0 to P7 using this value is shown in FIG. 8(a). The operation of the parity is performed by the encoder 110.

Figure 9B:
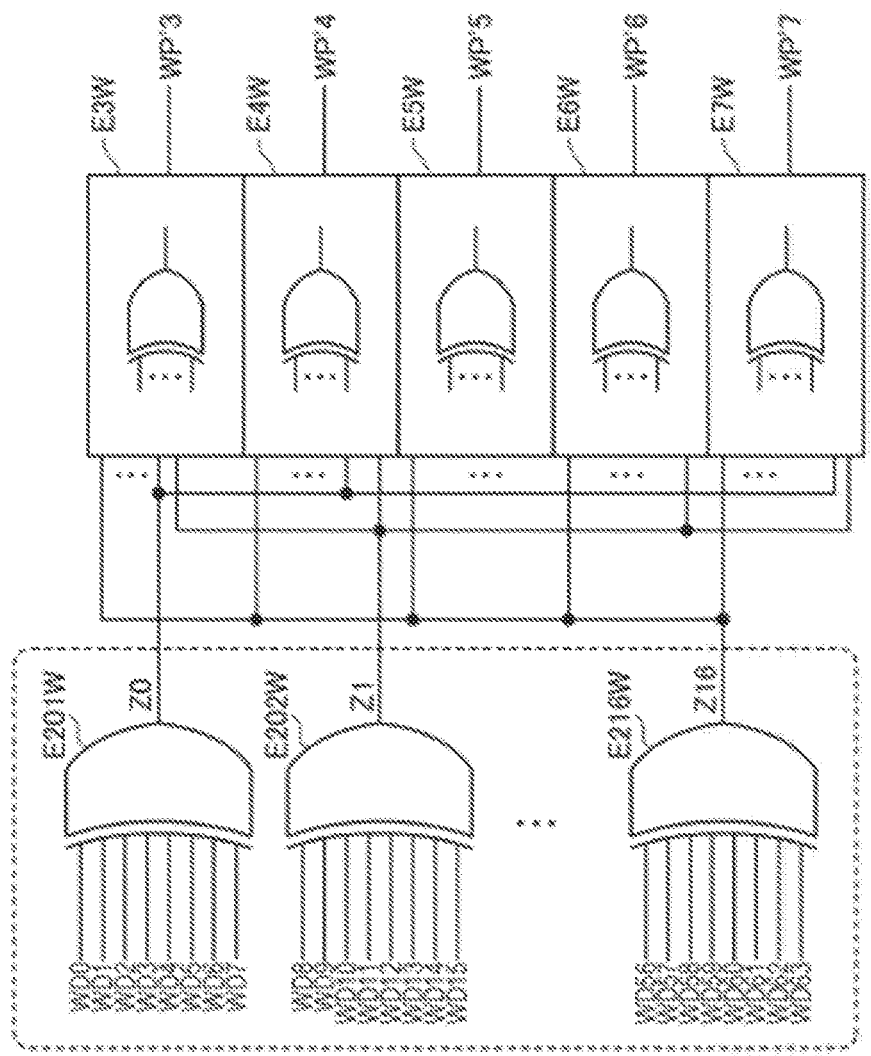
FIG. 9(b) is a circuit diagram of a circuit generating the write parities WP'3 to WP'7.
Figure 9A:
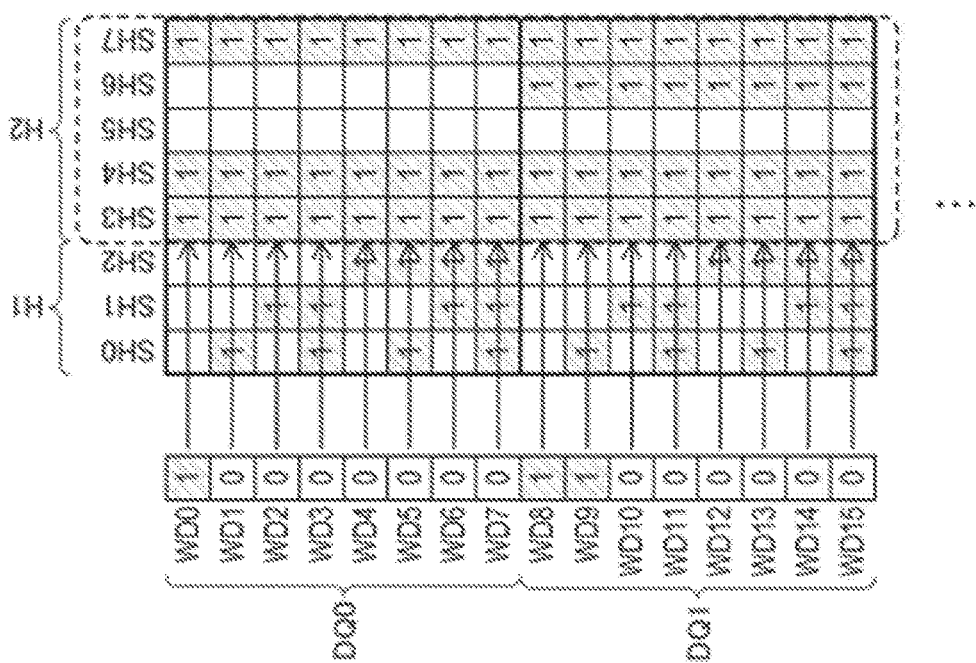
FIG. 9(a) is an illustrative diagram for illustrating a method of generating write parities WP'3 to WP'7.

FIGS. 8(a), (b) and FIGS. 9(a), (b) are diagrams for illustrating the configuration of the encoder 110, in particular. FIG. 8(a) is an illustrative diagram for illustrating a method of generating the write parity WP', FIG. 8(b) is a circuit diagram of a circuit generating the write parity WP', FIG. 9(a) is an illustrative diagram for illustrating a method of generating the write parities WP'3 to WP'7, and FIG. 9(b) is a circuit diagram of a circuit generating the write parities WP'3 to WP'7.

First, an operation is performed on the write parity WP' using a row SH0 corresponding to the syndrome S0. The row SH0 corresponding to the syndrome S0 is contained in the first determinant H1. Further, the first determinant H1, as already described, has a value identical for the respective data regions A0 to A7 and different for the respective burst data of 8 bits. As shown in FIG. 8(a), the row SH0 corresponding to the syndrome S0 has a value "0101010101" by way of example in a burst order. This value is common to respective DQ locations.

Further, as shown in FIG. 8(b), of the write data WD0 to WD7 of 8 bits to be written into the data region A0, the data WD1, WD3, WD5, WD7 are inputted into a four-input exclusive OR circuit E00W. Regarding the write data of 8 bits to be written into the other respective data regions A1 to A7, similarly, corresponding write data of 4 bits are inputted into four-input exclusive OR circuits E01W to E07W, respectively.

Further, outputs from the four exclusive OR circuits E00W to E03W are inputted into a four-input exclusive OR circuit E11W, and outputs from the four exclusive OR circuits E04W to E07W are inputted into a tour-input exclusive OR circuit E12W. Then, outputs ENC0_DQ0-3 and ENC0_DQ4-7 from these two exclusive OR circuits E11W, E12W are inputted into a two-input exclusive OR circuit E13W, and a value obtained is outputted as the write parity WP'. Thereby, parity determination is performed on the number of write data WD0 to WD63 whose values are "1" at a spot represented as "1" in the row SH0 corresponding to the syndrome S0 of the determinants shown in FIG. 7 and FIG. 8, and if the number is even, then the value of the write parity WP' is "0", but if the number is odd, then the value of the write parity WP' is "1".

Regarding a method of generating the write parities WP'1 and WP'2, similarly, parity determination is performed on the number of write data WD0 to WD63 whose values are "'1" at a spot represented as "1" in the rows SH1, SH2 corresponding to the syndromes S1 and S2, respectively, of the determinants shown in FIG. 6 and FIG. 7. As shown in FIG. 8(a), the row SH1 corresponding to the syndrome S1 has a value "00110011" by way of example in a burst order. This value is common to respective DQ locations. In addition, the row SH2 corresponding to the syndrome S2 has a value "00001111" by way of example in a burst order, and this value is common to respective DQ locations. Then, as a result of the parity determinations by a similar circuit to FIG. 8(b), the values of the write parities WPM and WP'2 are calculated.

On the other hand, the operation of the write parities WP'3 to WP'7 is performed using rows SH3 to SH7 corresponding to the syndromes S3 to S7, respectively. The rows SH3 to SH7 corresponding to the syndromes S3 to S7 are contained in the second determinant H2. Further, the second determinant H2, as already described, has a value identical for the respective burst data of 8 bits and different for the respective data regions A0 to A7. As shown in FIG. 9(a), the second determinant H2 corresponding to DQ0 has a value "11001" for all the burst data.

As shown in FIG. 9(b), in the operation of the write parities WP'3 to WP'7, 16 exclusive OR circuits E201W to E216W are shared. For example, the exclusive OR circuit E201W performs an operation on the basis of the write data WD0 to WD3 of the write data WD0 to WD7 of 8 bits to be written into the data region A0, and the exclusive OR circuit E202W performs an operation on the basis of the write data WD4 to WD7 of the write data WD0 to WD7 of 8 bits to be written into the data region A0. Thereby, intermediate values Z0 to Z15 are generated from the 16 exclusive OR circuits E201W to E216W.

Then, exclusive OR circuits E3W to E7W further logically synthesize the intermediate values Z0 to Z15 obtained, thereby calculating the write parities WP'3 to WP'7. Specifically, when the write parity WP'3 is calculated, an exclusive OR synthesis using the intermediate values Z0 to Z7, Z12 to Z15 is performed, and if the value obtained is even, then the value of the write parity WP'3 is "0", but if the value obtained is odd, then the value of the write parity WP'3 is "1". Similarly, when the write parity WP'4 is calculated, an exclusive OR synthesis using the intermediate values Z0 to Z3, Z8 to Z15 are performed, and if the value obtained is even, then the value of the write parity WP'4 is "0", but if the value obtained is odd, then the value of the write parity WP'4 is "1". Which intermediate value Z0 to Z15 is selected depends on the second determinant 112 of the determinants shown in FIG. 6.

In this manner, many exclusive OR circuits E201W to W216W are shared in the operation of the write parities WP'3 to WP'7, so that the circuit scale of the encoder 110 can be reduced.

Figure 10:
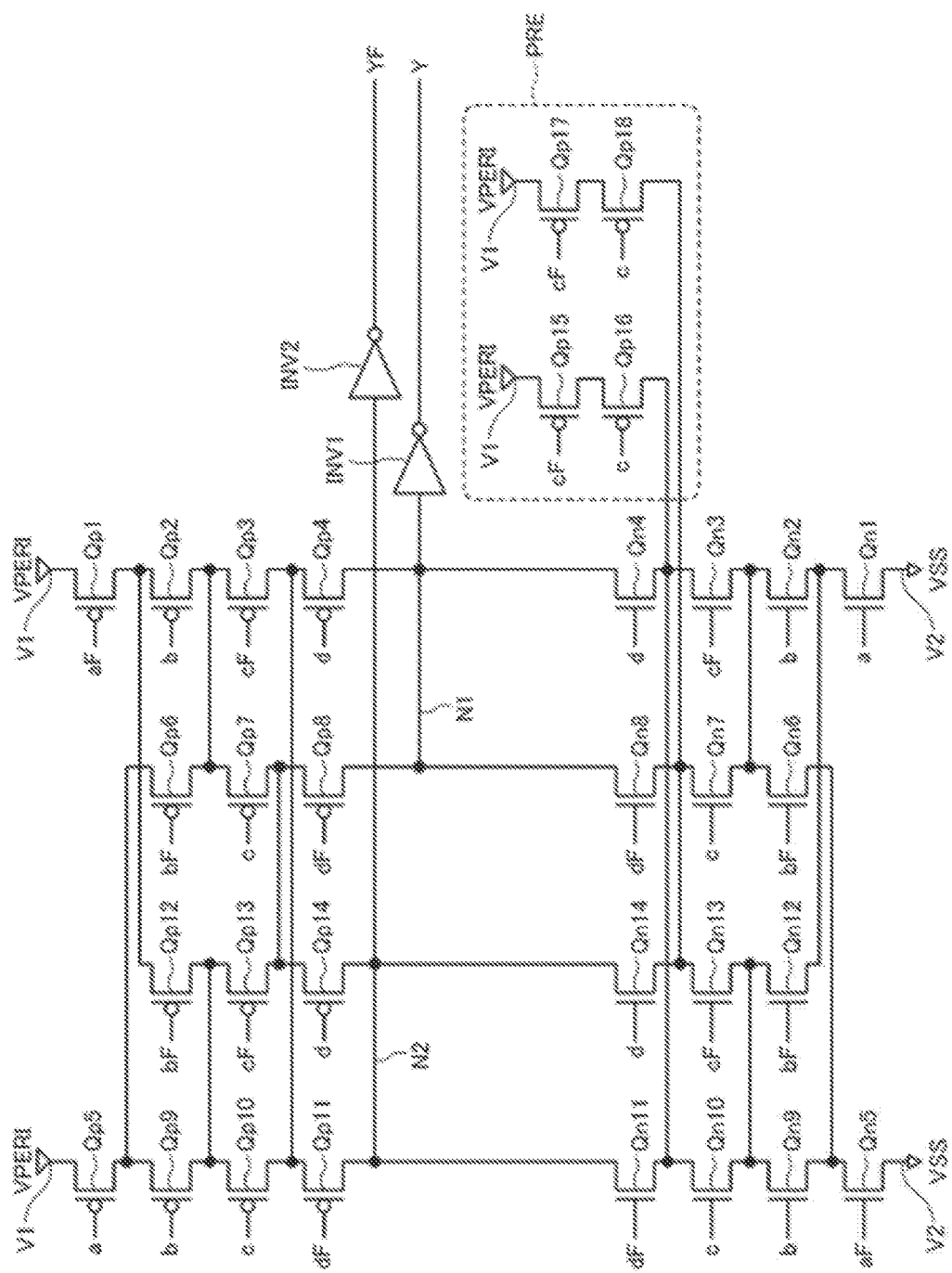
FIG. 10 is a circuit diagram showing the configuration of a four-input exclusive OR circuit.

FIG. 10 is a circuit diagram showing the configuration of the four-input exclusive OR circuit.

In FIG. 10, a signal of 4 bits to be inputted is denoted by reference signs "a" to "d", and an inverted signal thereof is denoted by reference signs aF to dF. These signals "a" to d", aF to dF are inputted into gate electrodes corresponding to PMOSs Qp1 to Qp14 and NMOSs Qn1 to Qn14. Then, a signal appearing in a node N1 is outputted as a signal V via an inverter INV1, while a signal appearing in a node N2 is outputted as a signal YF via an inverter INV2.

Between a voltage line V1 supplied with the voltage potential VPBR1 and the node NT, the transistors Qp1 to Qp4 are connected in series in this order, and the transistors Qp5 to Qp8 are connected in series in this order. Further, between the voltage line V1 and the node N2, the transistors Qp5, Qp9 to Qp11 are connected in series in this order, and the transistors Qp1, Qp12 to Qp14 are connected in series in this order. The drains of the transistors Qp2, Qp6 are connected to each other, the drains of the transistors Qp3, Qp10 are connected to each other, the drains of the transistors Qp9, Qp12 are connected to each other, and the drains of the transistors Qp7, Qp13 are connected to each other.

Between a voltage line V2 supplied with the ground potential VSS and the node N1, the transistors Qn1 to Qn4 are connected in series in this order, and the transistors Qn5 to Qn8 are connected in series in this order. Further, between the voltage line V2 and the node N2, the transistors Qn5, Qn9 to Qn11 are connected in series in this order, and the transistors Qn1, Qn12 to Qn14 are connected in series in this order. Further, the drains of the transistors Qn2, Qn6 are connected to each other, the drains of the transistors Qn3, Qn10 are connected to each other, the drains of the transistors Qn9, Qn12 are connected to each other, and the drains of the transistors Qn7, Qn13 are connected to each other.

The signal "a" is inputted into gate electrodes of the transistors Qp5, Qn1, and the signal aF is inputted into gate electrodes of the transistors Qp1, Qn5. The signal "b" is inputted into gate electrodes of the transistors Qp2, Qp9, Qn2, Qn9, and the signal bF is inputted into gate electrodes of the transistors Qp6, Qp12, Qn6, Qn12. The signal c is inputted into gate electrodes of the transistors Qp7, Qp10, Qn7, Qn10, and the signal cF is inputted into gate electrodes of the transistors Qp3, Qp13, Qn3, Qn13. The signal "d" is inputted into gate electrodes of the transistors Qp4, Qp14, Qn4, Qn14, and the signal dF is inputted into gate electrodes of the transistors Qp8, Qp11. Qn8, Qn11.

With such a configuration, exclusive OR operations are performed on the signals "a" to "d" of 4 bits and the inverted signals thereof aF to dF, and the results of the operations are outputted as the signal Y and the inverted signal thereof YF.

Further, in order to reset both the signals Y, YF to low levels in an initial state, a precharge circuit PRE is provided. The precharge circuit PRE is composed of PMOSs Qp15. Qp16 connected in series between the voltage line V1 and the drains of the transistors Qn3, Qn10, and PMOSs Qp17, Qp18 connected in series between the voltage line V1 and the drains of the transistors Qn7, Qn13. The signal cF is inputted into gate electrodes of the transistors Qp15, Qp17, and the signal "c" is inputted into gate electrodes of the transistors Qp16, Qp18. Both the signals "c" and cF are signals that are at low levels in an initial state, and thereby both the signals Y, YF in the initial states are reset to low levels.

With a four-input exclusive OR circuit having such a configuration, the number of elements can be reduced as compared with a case where ordinary two-input exclusive OR circuits are connected in multistage, and the operation can be performed at a high speed.

Figure 11:
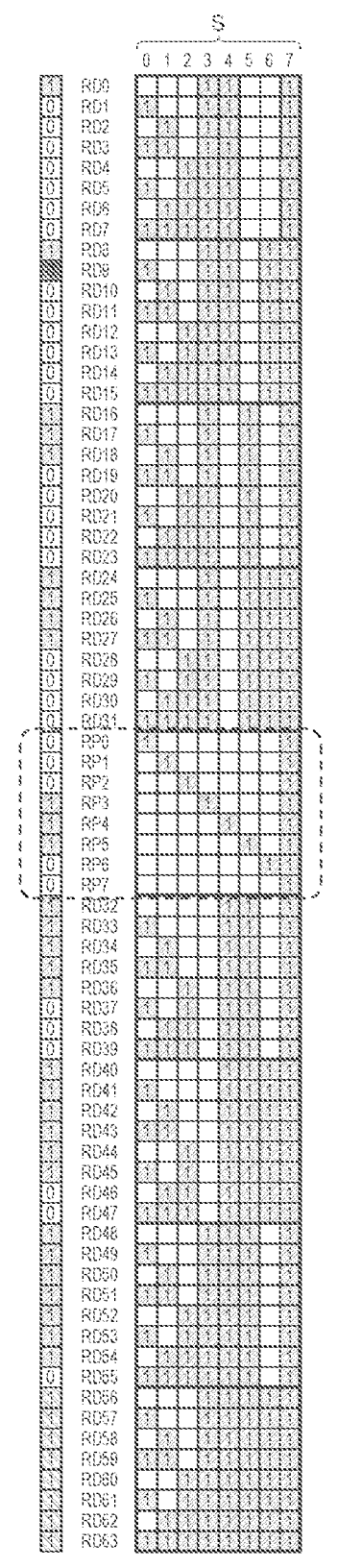

FIG. 11 is a diagram for illustrating the function of the syndrome generator 120.

FIG. 11 shows an example of specific values of the read data RD0 to RD63 and the read panties RP0 to RP7. On them, an error has occurred in the read data RD9, where the correct value is "1", though the actual value is "0". If an error is not contained in the read data RD0 to RD63, then the values of the syndromes S0 to S7 are all "0", but, if an error of 1 bit is contained, then several bits of the syndromes S0 to S7 are "1". In this case, a column in an H matrix having the same value as the syndromes S0 to S7 corresponds to an error bit.

FIGS. 12(a), (b) and FIGS. 13(a), (b) are diagrams for illustrating the configuration of the syndrome generator 120, in particular, FIG. 12(a) is an illustrative diagram for illustrating a method of generating the syndrome S0. FIG. 12(b) is a circuit diagram of a circuit generating the syndrome S0. FIG. 13(a) is an illustrative diagram for illustrating a method of generating the syndromes S3 to S7. FIG. 13(b) is a circuit diagram of a circuit generating the syndromes S3 to S7.

As shown in FIG. 12(a), the principle of generating the syndrome S0 is basically the same as the principle of generating the write parity WP' shown in FIG. 8(a), but the generation of the syndrome S0 needs the corresponding read parity RP0. Therefore, as shown in FIG. 12(b), the circuit for generating the syndrome S0 only needs to be configured by adding the read parity RP0 to the exclusive OR operation in addition to the circuit shown in FIG. 8(b). Regarding the method of generating the syndromes S1, S2, similarly, it is only necessary to add the read parities RP1, RP2 to the exclusive OR operations, respectively.

As shown in FIG. 13(a), the principle of generating the syndromes S3 to S7 is basically the same as the principle of generating the write parities WP'3 to WP'7 shown in FIG. 9(a), but the generation of the syndromes S3 to S7 needs the corresponding read parities RP3 to RP7, respectively. Therefore, as shown in FIG. 13(b), the circuit for generating the syndromes S3 to S7 only needs to be configured by adding the read parities RP3 to RP7, respectively, to the exclusive OR operations in addition to the circuit shown in FIG. 9(b).

In this manner, the circuits for generating the syndromes S0 to S7 have configurations most of which are coincident with the circuits for generating the write parities WP' to WP'7. Therefore, by using the circuits in common in a time-dividing manner, the circuit scale of the KCC control circuit 100 can be reduced. However, in this case, the encoder 110 and the syndrome generator 120 cannot simultaneously start up, and, for this reason, in the embodiment, in order to achieve a high-speed operation, the encoder 110 and the syndrome generator 120 are configured by separate circuits.

Figure 14:
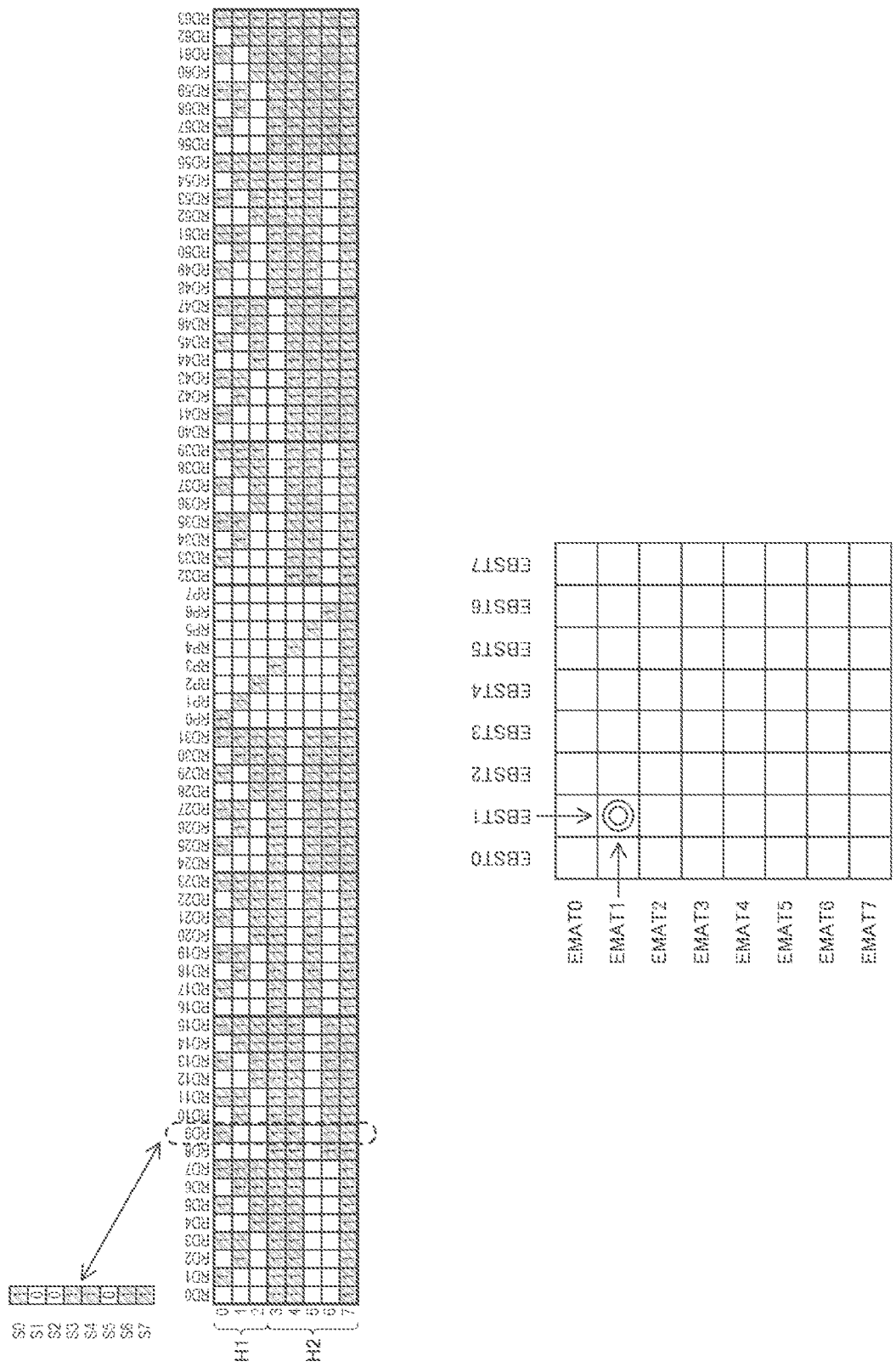
FIG. 14 is a schematic diagram for illustrating functions of error locators 130,140.

FIG. 14 is a schematic diagram tor illustrating the functions of the error locators 130, 140.

In an example shown in FIG. 14, the value of the syndromes S0 to S7 outputted from the syndrome generator 120 is "1001011", from which it is found that and this shows that an error is present in the read data RD9. Then, in the embodiment, the burst location of the error data is specified on the basis of the syndromes S0 to S2, and the DQ location of the error data is specified on the basis of the syndromes S3 to S7. The burst location is specified by decoding the syndromes S0 to S2 and activating 1 bit of error burst signals EBST0 to EBST7. The DQ location is specified by decoding the syndromes S3 to S6 and activating 1 bit of error mat signals EMAT0 to EMAT7. The error burst signals EBST0 to EBST7 and the error mat signals BMAT0 to EMAT7 are generated by the error locator 130. It should be noted that the syndrome S7 is "0" when error bits exists by 2 bits, and cannot be corrected in this case.

Then, by further decoding the error burst signals EBST0 to EBST7 and the error mat signals EMAT0 to EMAT7, the error bits are specified. Such decoding is performed by the error locator 140. In the example shown in FIG. 14, because the error burst signal EBST1 and the error mat signal EMAT1 are activated, it is found that that the read data RD9 is the error bit.

Figure 15:
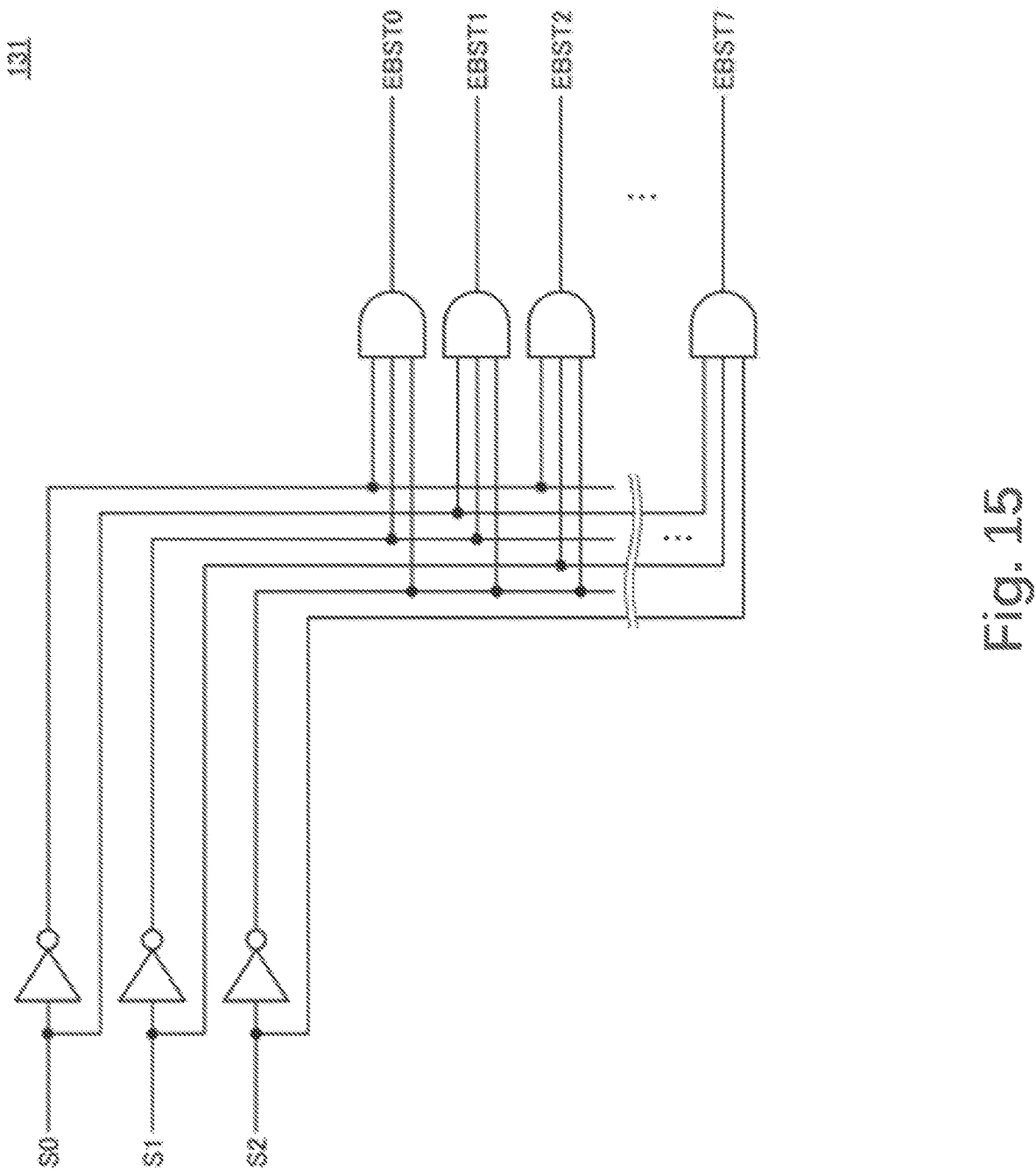
FIG. 15 is a circuit diagram of a decoder 131 included in the error locator 130.

FIG. 15 is a circuit diagram of a decoder 131 included in the error locator 130. As shown in FIG. 15, the decoder 131 decoding the syndromes S0 to S2 is included in the error locator 130. Thereby, if an error bit is contained in the read data RD0 to RD63, then 1 bit of the error burst signals BBST0 to BBST7 is activated.

Figure 16:
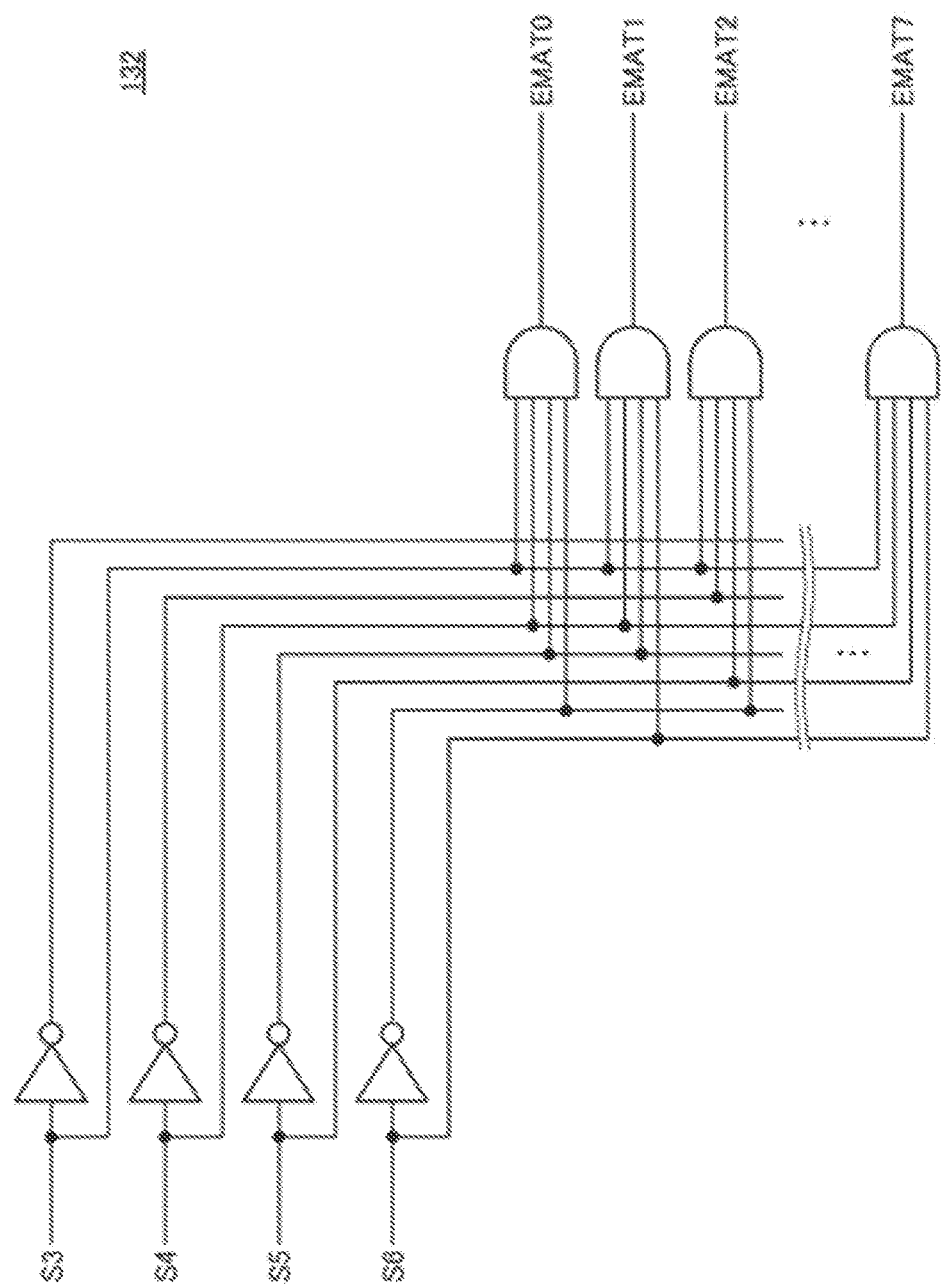
FIG. 16 is a circuit diagram of a decoder 132 included in the error locator 130.

FIG. 16 is a circuit diagram of a decoder 132 included in the error locator 130. As shown in FIG. 16, the decoder 132 decoding the syndromes S3 to S6 is included in the error locator 130. Thereby, if an error bit is contained in the read data RD0 to RD63, then 1 bit of the error mat signals EMAT0 to EMAT7 is activated.

The error burst signals EBST0 to EBST7 and the error mat signals EMAT0 to BMAT7 thus generated are supplied to the error locator 140.

Figure 17:
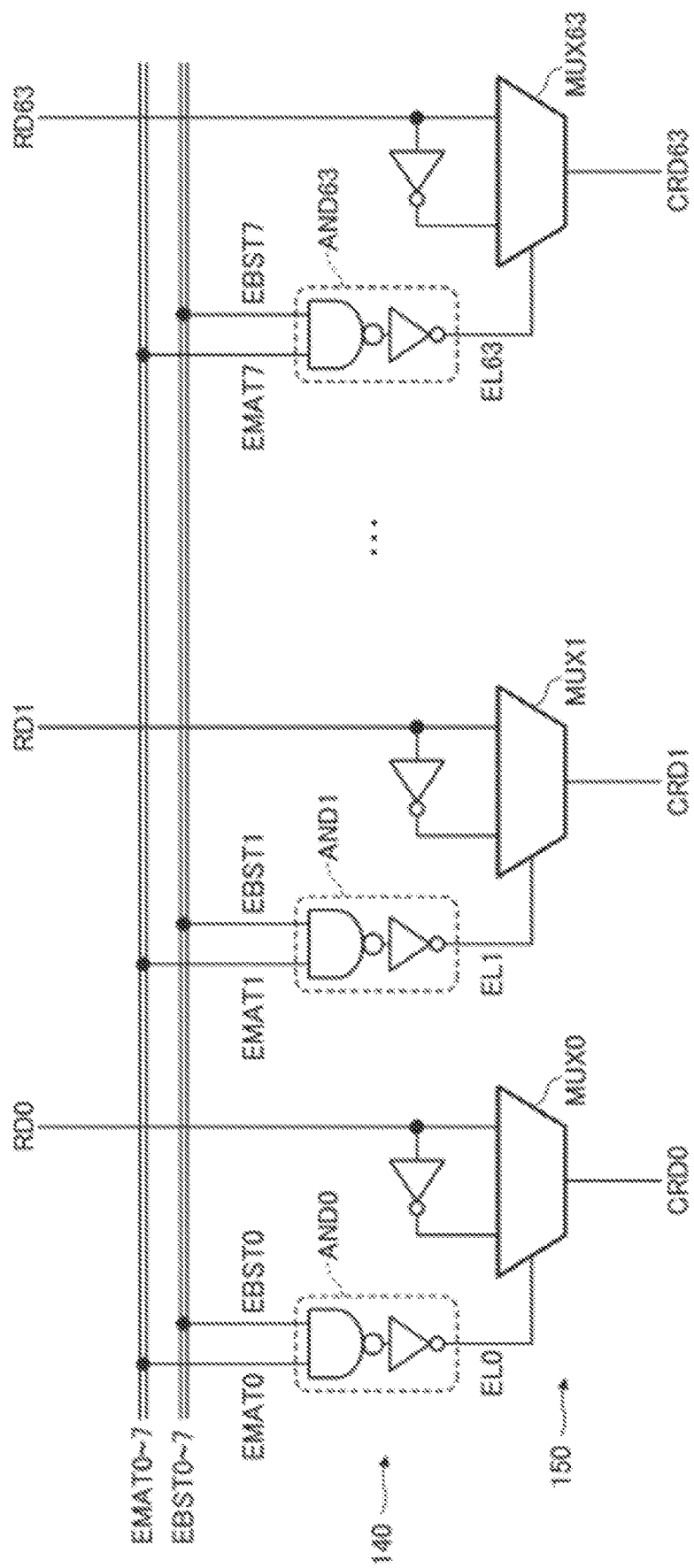
FIG. 17 is a circuit diagram of the error locator 140 and an error corrector 150.

FIG. 17 is a circuit diagram of the error locator 140 and an error corrector 150.

As shown in FIG. 17, the error locator 140 is composed of 64 AND gate circuits AND0 to AND63 receiving corresponding 1 bit of the error burst signals EBST0 to EBST7 and corresponding 1 bit of the error mat signals BMAT0 to EMAT7. If an error bit is contained in the read data RD0 to RD63, then 1 bit of the error burst signals EBST0 to EBST7 and 1 bit of the error mat signals EMAT0 to EMAT7 are activated, so that one of error location signals EL0 to EL63 outputted from the AND gate circuits AND0 to AND63 is activated to a high level.

The error location signals EL0 to EL63 are supplied to 64 multiplexers MUX0 to MUX63 constituting the error corrector 150. The multiplexers MUX0 to MUX63 select either the corresponding read data RD0 to RD63 or inverted signals thereof, respectively, and output it as corrected read data CRD0 to CRD63. Specifically, if the corresponding error location signals EL0 to EL63 are inactive at low level, the read data RD0 to RD63 which are not inverted are outputted, respectively, but if the corresponding error location signals EL0 to EL63 are active at high level, the inverted signals of the corresponding read data RD0 to RD63 are outputted, respectively. Thereby, only an error bit is inverted, so that the corrected read data CRD0 to CRD63 are generated.

Figure 18:
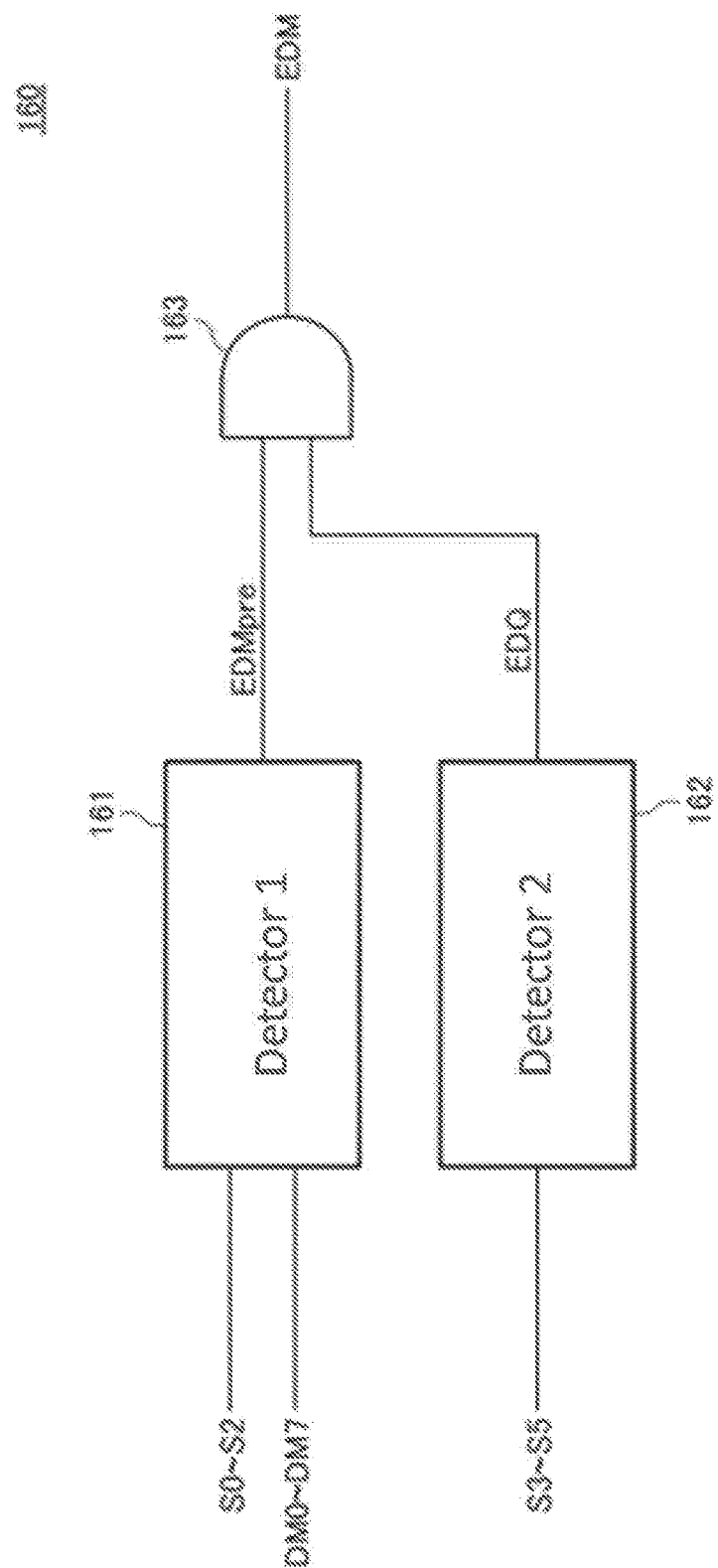
FIG. 18 is a block diagram showing a configuration of a mask error detecting circuit 160.

FIG. 18 is a block diagram showing the configuration of the mask error detector 160.

As shown in FIG. 18, the mask error detector 160 includes a first detector 161 and a second detector 162. The first detector 161 is a circuit determining whether or not the burst location of an error bit and the burst location of a write data masked by the data mask signals DM0 to DM7 are coincident, and if both are coincident, then a detection signal EDMpre is activated. The second detector 162 is a circuit determining whether or not an error bit is contained in any of the DQ locations, and if an error bit is contained in any of the DQ locations, then the detection signal EDQ is activated.

Figure 19:
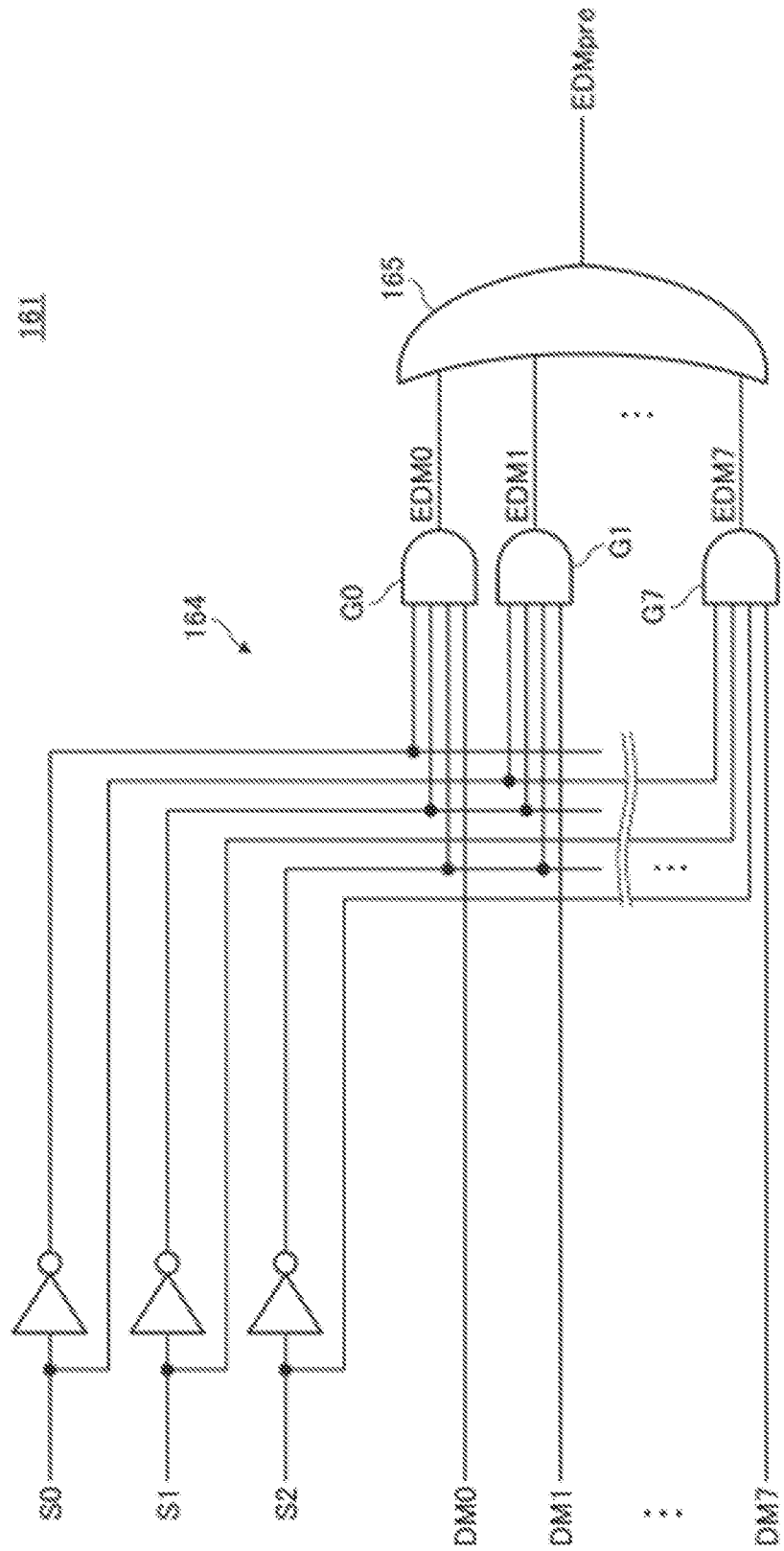
FIG. 19 is a circuit diagram of a first detecting circuit 161.

FIG. 19 is a circuit diagram of the first detector 161.

As shown in FIG. 19, the first detector 161 includes a decoder 164 decoding the syndromes S0 to S2, and the data mask signals DM0 to DM7 are inputted into eight AND gate circuits G0 to G7, respectively, included in this decoder 164. With such a configuration, if the burst location of the error bit and the burst location of the write data masked are coincident, any one of output signals EDM0 to EDM7 of the AND gate circuits G0 to G7 is activated to high level. Then, the output signals EDM0 to EDM7 are inputted into an eight-input OR gate circuit 165, and an output signal thereof is outputted as the detection signal EDMpre. Therefore, if the burst location of the error bit and the burst location of the write data masked are coincident, the detection signal EDMpre is activated to high level. It should be noted that the coincidence in this context also encompasses a case where, if a plurality of burst locations of the write data masked exist, the burst location of the error bit belongs to any one of the plurality of burst locations of the write data masked.

In contrast, if the burst location of the error bit and the burst location of the write data masked are not coincident, the detection signal EDMpre is deactivated to low level. Of course, when no error bit exists, or when data masking is not performed, the detection signal EDMpre is also deactivated to low level. It should be noted that an equivalent function can also be achieved not by actually using the AND gate circuits G0 to G7 and the OR gate circuit 165 but by using a wired logic.

Figure 20:
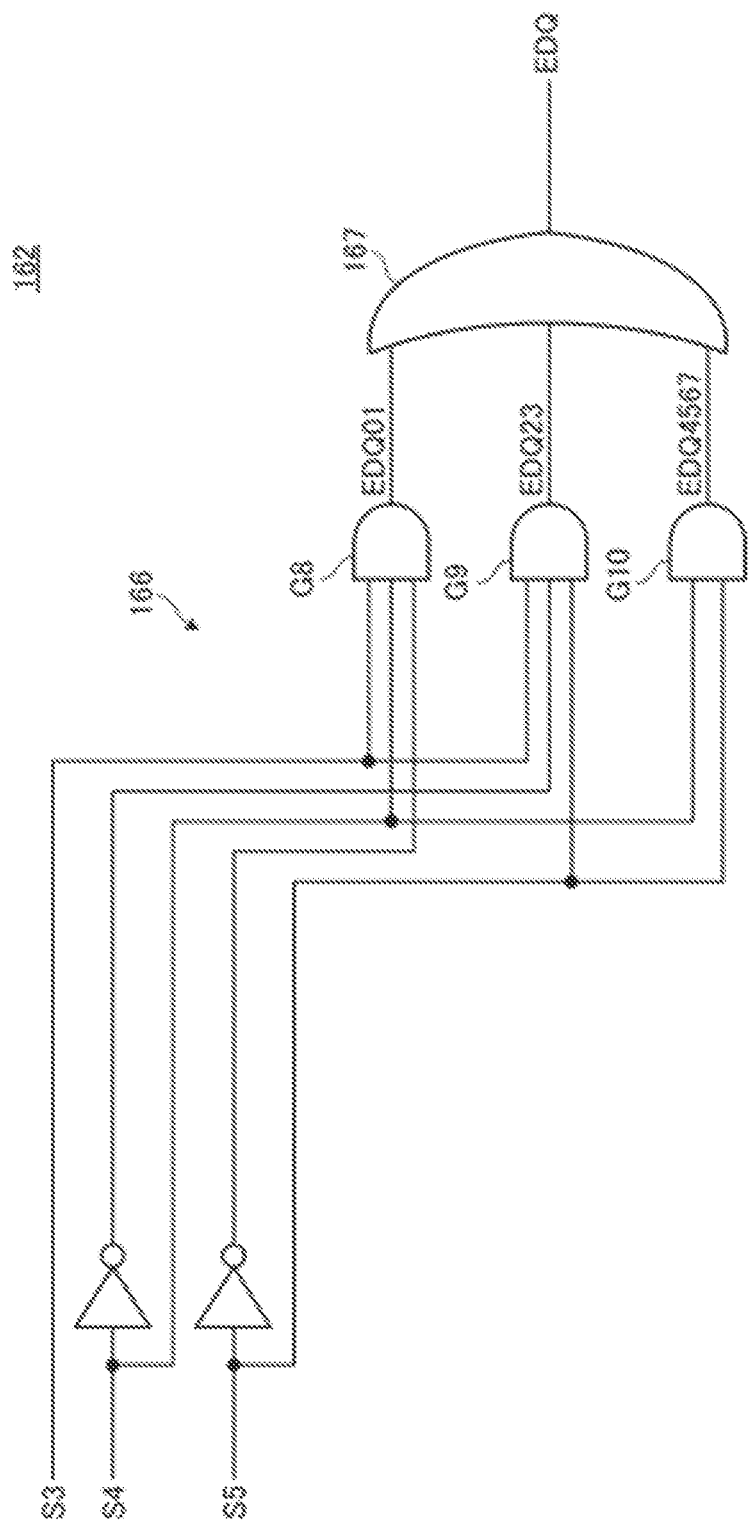
FIG. 20 is a circuit diagram of a second detecting circuit 162.

FIG. 20 is a circuit diagram of the second detector 162.

As shown in FIG. 20, the second detector 162 includes a decoder 166 decoding the syndromes S3 to S5. Three AND gate circuits G8 to G10 constituting the decoder 166 generate output signals EDQ01, EDQ23, EDQ4567, respectively. The output signal EDQ01 is activated if the DQ location of the error bit is DQ0 or DQ1, the output signal EDQ23 is activated if the DQ location of the error bit is DQ2 or DQ3, and the output signal EDQ4567 is activated if the DQ location of the error bit is DQ4 or DQ7. Then, the output signals EDQ01, EDQ23, EDQ4567 are inputted into a three-input OR gate circuit 167, and an output signal thereof is outputted as the detection signal EDQ. It should be noted an equivalent function can also be achieved not by using the AND gate circuits G8 to G10 and the OR gate circuit 167 but by using a wired logic.

The detection signal EDMpre generated by the first detector 161 and the detection signal EDQ generated by the second detector 162 are inputted into the AM) gate circuit 163 shown in FIG. 19. Therefore, the conversion signal EDM that is an output of the AND gate circuit 163 is activated when both the detection signal EDMpre and the detection signal EDQ are at high level. The conversion signal EDM thus generated is supplied to the conversion circuit 105 shown in FIG. 3.

As has been already described, the conversion circuit 105 is composed of the exclusive OR gate 105a logically synthesizing corresponding bits of the write parities WF to WP″7 and the syndromes S0 to S7, and the multiplexer 105b. Further, an exclusive OR operation is performed when the conversion signal EDM is active at high level, and thereby the write parities WP0 to WP7 are generated. On the other hand, if the conversion signal EDM is inactive at low level, the write parities WP' to WP″7 are outputted as the write parities WP0 to WP7 as they are.

A specific circuit configuration of the semiconductor device 10 according to the embodiment has been described above. Next, an operation of the semiconductor device 10 is described.

Figure 21:
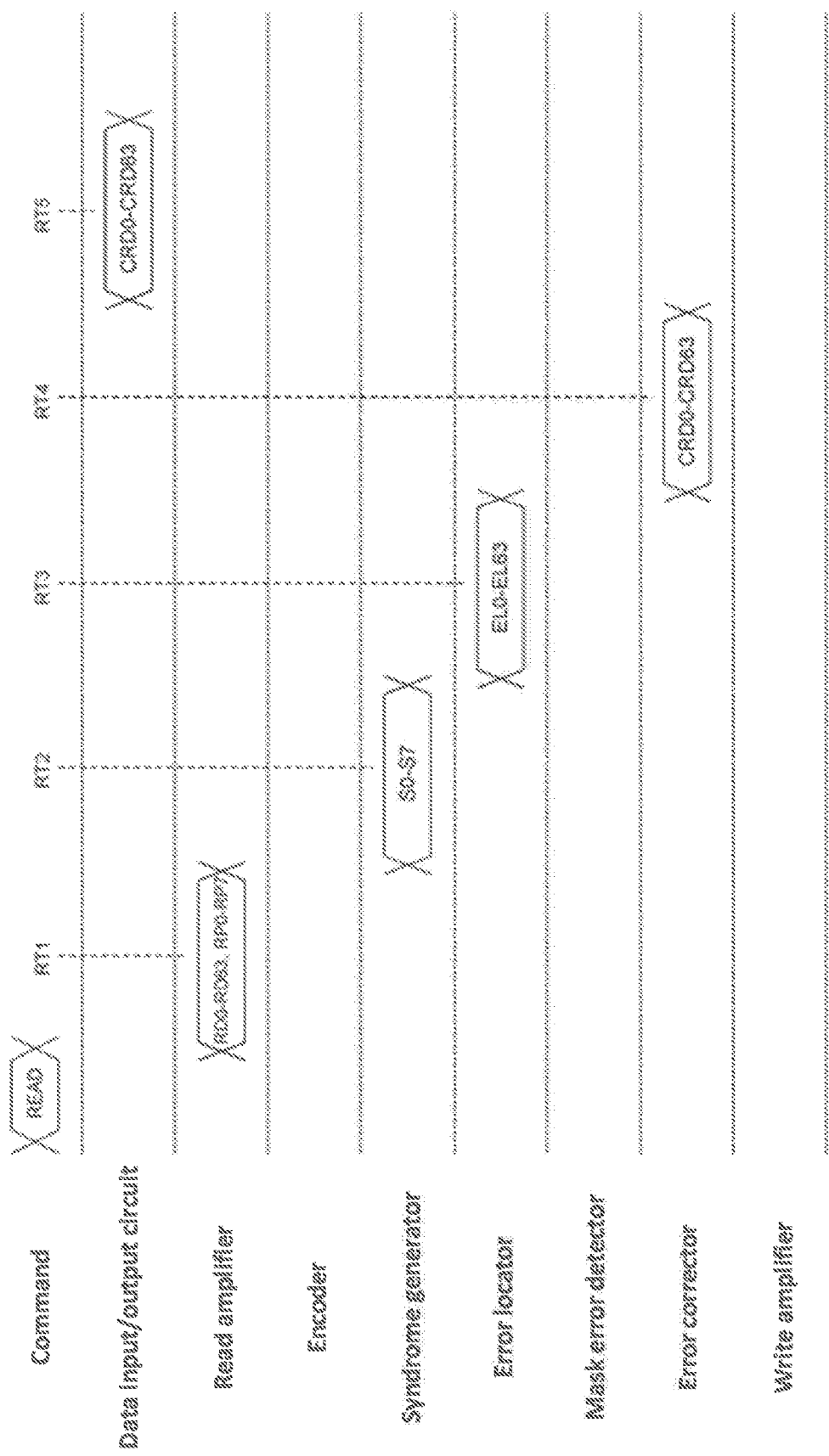
FIG. 21 is a timing diagram for illustrating a read operation of a semiconductor device 10.

FIG. 21 is a timing diagram for illustrating the read operation of the semiconductor device 10 according to the embodiment.

When a read command READ is issued from outside via the command terminal 22, the timing signals RT1 to RT4 are activated in this order by the signal generator 37R shown in FIG. 5. First, the read amplifier 101 is activated in response to the timing signal RT1, and thereby the read data RD0 to RD63 and the read parities RP0 to RP7 read from the memory cell array 11 are amplified. The read data RD0 to RD63 and the read parities RP0 to RP7 amplified are transferred to the syndrome generator 120.

Next, the syndrome generator 120 is activated in response to the timing signal RT2, and the generation of the syndromes S0 to S7 is performed. The syndromes S0 to S7 generated are transferred to the error locator 130.

Next, the error locator 130 is activated in response to the timing signal RT3, and the syndromes S0 to S7 are decoded. The first error determination signals BBST0 to BBST7 and the second error determination signals EDQ0 to EDQ7 thereby generated are further decoded by the error locator 140, and the error location signals EL0 to BL63 are generated. The error location signals EL0 to EL63 generated are transferred to the error corrector 150.

Next, the error corrector 150 is activated in response to the timing signal RT4, and the correction of the read data RD0 to RD63 is performed. Thereby, the corrected read data CRD0 to CRD63 are generated, and transferred to the data input/output circuit 14 via the read write bus RWBS. Then, the data input/output circuit 14 is activated to the following timing RT5, and the corrected read data CRD0 to CRD63 are burst-outputted to outside via the eight data terminals 24.

In this manner, an error bit contained in the read data RD0 to RD63 is corrected by the ECC control circuit 100 during the read operation, and the read data CRD0 to CRD63 are burst-outputted.

Figure 22:
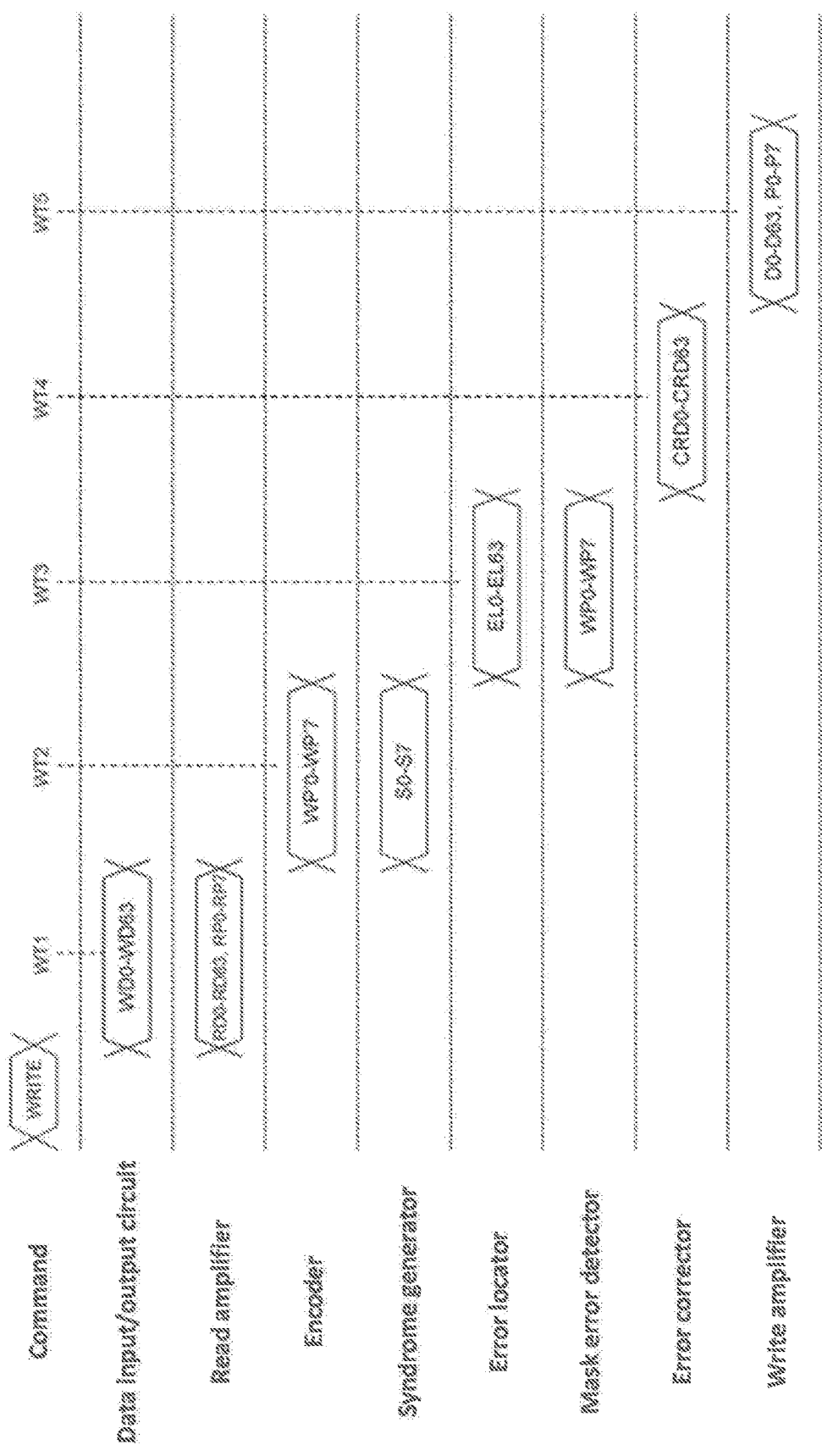
FIG. 22 is a timing diagram for illustrating a write operation of the semiconductor device 10.

FIG. 22 is a timing diagram for illustrating the write operation of the semiconductor device 10 according to the embodiment.

When a write command is issued from outside via the command terminal 22, the timing signals WT1 to WT5 are activated in this order by the signal generator 37W shown in FIG. 5. Further, the write data WD0 to WD63 are burst-inputted from outside via the eight data terminals 24 in synchronism therewith, the data mask signals DM0 to DM7 are burst-inputted from outside via one data mask terminal 25, and then the data input/output circuit 14 is activated in response to the timing signal WT1. Thereby, the write data WD0 to WD63 and the data mask signals DM0 to DM7 are transferred to the ECC control circuit 100 via the read write bus RWBS. Further, the read amplifier 101 is activated in response to the timing signal WT1, and thereby the read data RD0 to RD63 and the read parities RP0 to RP7 read from the memory cell array 11 are amplified. The read data RD0 to RD63 and the read parities RP0 to RP7 amplified are transferred to the syndrome generator 120.

Next, the encoder 110 is activated in response to the timing signal WT2, and the generation of the write parities WP' to WP″7 is performed. The write parities WP' to WP″7 generated are transferred to the converter 105. Further, the syndrome generator 120 is activated in response to the timing signal WT2, and the generation of the syndromes S0 to S7 is performed. The syndromes S0 to S7 generated are transferred to the error locator 130, and also transferred to the mask error detector 160.

Next, the mask, error detector 160 is activated in response to the timing signal WT3, and the generation of the conversion signal EDM is performed. The conversion signal EDM generated is transferred to the conversion circuit 105, and thereby the write parities WP0 to WP7 are generated. The write parities WP0 to WP7 generated are transferred to the write amplifier 102. Further, the error locator 130 is activated in response to the timing signal WT3, and the syndromes S0 to S7 are decoded. The first error determination signals EBST0 to EBST7 and the second error detection signals EDQ0 to EDQ7 thereby generated are further decoded by the error locator 140, and the error location signals EL0 to EL63 are generated. The error location signals EL0 to EL63 generated are transferred to the error corrector 150.

Next, the error corrector 150 is activated in response to the timing signal WT4, and the correction of the read data RD0 to RD63 is performed. Thereby, the corrected read data CRD0 to CRD63 are generated. The corrected read data CRD0 to CRD63 are transferred to the write amplifier 102 via the multiplexer 103.

Then, the write amplifier 102 is activated in response to the timing signal WT5, and the data D0 to D63 and the parities P0 to P7 are written into the memory cell array 11.

In this manner, the read operation is also performed during the write operation, and the corrected read data CRD0 to CRD63 and the write data WD0 to WD63 are synthesized on the basis of the data mask signals DM0 to DM7, and the data D0 to D63 to be actually written into the memory cell array 11 are generated. Therefore, even when one or more of the data mask signals DM0 to DM7 are activated, the data D0 to D63 to be written can be correctly generated.

In addition, since the write parities WP0 to WP7 are generated on the basis of the syndromes S0 to S7 and the write parities WP'0 to WP'7 in parallel with the operation of correcting the read data RD0 to RD63, the write parities WP0 to WP7 can be early generated. That is, the write parities WP0 to WP7 can be also correctly generated by disposing the encoder 110 in a downstream stage of the multiplexer 103, but, in this case, it takes time before the write parities WP0 to WP7 are generated. In contrast, in the embodiment, since the data for parity generation PWD0 to PWD63 are generated on the basis of the write data WD0 to WD63 and the read data RD0 to RD63 before correction, and the write parities WP'0 to WP'7 are generated on the basis of the data for parity generation PWD0 to PWD63, the write parities WP0 to WP7 can be generated ahead utilizing the syndromes S0 to S7 without waiting for the operation of correcting the read data RD0 to RD63.

Thereby, the time required for the write operation can be made substantially coincident with the time required for the read operation, so that the access efficiency can be increased, and foe compatibility with an ordinary DRAM specification can be secured.

The preferred embodiment of the present invention has been described above, but the present invention is not limited to the above embodiment, and can be modified variously without departing from the gist of the present invention, and, for example, applied not only to a volatile memory typified by a DRAM or SRAM, but also to a nonvolatile memory, such as a flash memory, ReRAM, MRAM. STT-RAM, or PRAM, and obviously these are also included within the scope of the present invention.

What is claimed is:

1. An apparatus comprising:
a memory cell array including a plurality of memory cells;
a plurality of data terminals, each data terminal of the plurality of data terminals being configured to provide a plurality of burst bits; and
an error correction code (ECC) control circuit coupled between the memory cell array and the plurality of data terminals, including:
a read amplifier configured to receive:
a plurality of data bits; and
a plurality of parity bits; and
a syndrome generator configured to generate a syndrome based on the plurality of data bits and the plurality of parity bits,
wherein the ECC control circuit is configured to provide a determinant based on the syndrome, and to detect an error bit, if any, in the plurality of data bits based on the determinant, and further configured to correct the detected error bit based on the determinant and to provide the plurality of burst bits including the plurality of data bits after the correction, if the error bit is detected.

2. The apparatus of claim 1, wherein the determinant includes a portion identical for the plurality of data terminals.

3. The apparatus of claim 2, wherein a number of bits in the syndrome is a natural number M, and
wherein a number of bits in the plurality of burst bits is less than two to the Mth power.

4. The apparatus of claim 3, further comprising an error locator configured to specify a location of the error bit within the plurality of burst bits.

5. The apparatus of claim 1, wherein the determinant includes a portion identical for the plurality of burst bits.

6. The apparatus of claim 5, wherein a number of bits in the syndrome is a natural number N, and
wherein a relationship between a number of the plurality of data terminals n and the number of bits N in the syndrome is represented by a following inequality:

$$n <\ _2C_N +\ _3C_N + \ldots\ _NC_N.$$

7. The apparatus of claim 6, further comprising an error locator configured to specify a location of the error bit within the plurality of data terminals.

8. The apparatus of claim 6, wherein the number of bits N is configured to enable the ECC control circuit to detect a plurality of error bits.

9. A method comprising:
receiving a plurality of data bits and a plurality of parity bits;
generate a syndrome based on the plurality of data bits and the plurality of parity bits;
providing a determinant based on the syndrome;
detecting an error bit, if any, in the plurality of data bits based on the determinant;
correcting the detected error bit based on the determinant; and
providing a plurality of burst bits from a plurality of data terminals, the plurality of burst bits in the plurality of data bits after the correction.

10. The method of claim 9, wherein the determinant includes a portion identical for the plurality of data terminals.

11. The method of claim 10, wherein the portion of the determinant corresponds to a syndrome based on the plurality of data bits and the plurality of parity bits,
wherein a number of bits in the syndrome is a natural number M, and wherein a number of bits in the plurality of burst bits is less than two to the Mth power.

12. The method of claim 9, further comprising specifying a location of an error bit within the plurality of burst bits.

13. The method of claim 12, wherein the determinant includes a portion identical for the plurality of burst bits.

14. The method of claim 13, wherein the portion of the determinant corresponds to a syndrome based on the plurality of data bits and the plurality of parity bits,
wherein a number of bits in the syndrome is a natural number N, and
wherein a relationship between a number of the plurality of data terminals n and the number of bits N in the syndrome is represented by a following inequality:

$$n < {_2C_N} + {_3C_N} + \ldots {_NC_N}.$$

15. The method of claim 14, further comprising specifying a location of the error bit within the plurality of data terminals.

16. The method of claim 14, further comprising setting the number of bits N to enable detecting a plurality of error bits.

17. An apparatus comprising:
a memory cell array including a plurality of memory cells, configured to store a plurality of data bits and a plurality of parity bits;
a plurality of data terminals, each data terminal of the plurality of data terminals being configured to provide a plurality of burst bits; and
a syndrome generator configured to generate a syndrome based on the plurality of data bits and the plurality of parity bits; and
an error locator configured to specify a location of an error bit within the plurality of burst bits and within the plurality of data terminals based on the syndrome.

18. The apparatus of claim 17, wherein the error locator comprises:

a first decoder configured to generate a first error determination signal having a number of bits equal to a number of the plurality of burst bits by decoding a first syndrome portion of the syndrome;
a second decoder configured to generate a second error determination signal having a number of bits equal to a number of the plurality of terminals by decoding a second syndrome portion of the syndrome; and
a third decoder configured to specify the location of the error bit based on the first and second error determination signals.

19. The apparatus of claim 18, further comprising:
an encoder configured to generate a plurality of parity bits based on the plurality of burst bits; and
a write amplifier configured to provide the plurality of burst bits and the plurality of parity bits to the memory cell array.

20. The apparatus of claim 19, further comprising:
a converter configured to receive a control signal and the plurality of parity bits, and further configured to provide the plurality of parity bits responsive to the control signal in an inactive state and further configured to provide another plurality of parity bits responsive, at least, to the plurality of parity bits, further responsive to the control signal in an active state.

21. The apparatus of claim 20, further comprising:
a data mask terminal configured to receive a data mask signal comprising a plurality of data mask bits corresponding to the plurality of burst bits; and
a mask error detection circuit configured to provide the control signal in the active state if a plurality of burst bits including an error bit matches the plurality of burst bits masked by the plurality of data mask bits.

* * * * *